(12) United States Patent
Desineni et al.

(10) Patent No.: US 10,650,067 B2
(45) Date of Patent: May 12, 2020

(54) CLOUD-ENABLED ARCHITECTURE FOR ON-DEMAND NATIVE APPLICATION CRAWLING

(71) Applicant: Samsung Electronics Co., Ltd., Suwon-si, Gyeonggi-do (KR)

(72) Inventors: Kalyan Desineni, Mountain View, CA (US); Sudhir Mohan, Saratoga, CA (US); Manikandan Sankaranarasimhan, Fremont, CA (US); Matan Levi, Mountain View, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1098 days.

(21) Appl. No.: 14/981,244

(22) Filed: Dec. 28, 2015

(65) Prior Publication Data
US 2017/0046437 A1 Feb. 16, 2017

Related U.S. Application Data

(60) Provisional application No. 62/204,974, filed on Aug. 13, 2015.

(51) Int. Cl.
| | |
|---|---|
| *G06F 16/9535* | (2019.01) |
| *G06F 16/951* | (2019.01) |
| *G06F 16/2455* | (2019.01) |
| *G06F 16/957* | (2019.01) |
| *G06F 30/20* | (2020.01) |

(52) U.S. Cl.
CPC .... *G06F 16/9535* (2019.01); *G06F 16/24552* (2019.01); *G06F 16/951* (2019.01); *G06F 16/9574* (2019.01); *G06F 30/20* (2020.01)

(58) Field of Classification Search
None
See application file for complete search history.

(56) References Cited

U.S. PATENT DOCUMENTS

| | | | |
|---|---|---|---|
| 7,657,652 B1 | 2/2010 | Balaji | |
| 8,863,223 B2 * | 10/2014 | Abbruzzese | G11B 5/584 345/1.1 |

(Continued)

OTHER PUBLICATIONS

PCT International Search Report and Written Opinion for PCT Application No. PCT/IB2016/054875 dated Nov. 30, 2016, 14 pages.

(Continued)

*Primary Examiner* — Grace Park
*Assistant Examiner* — Cheryl M Shechtman
(74) *Attorney, Agent, or Firm* — Jefferson IP Law, LLP

(57) ABSTRACT

A search system includes a query receiver, a live scrape system, and a content provider. The query receiver is configured to receive a first query related to a first application state of a first application. The first query is based on a user-requested search from a user device. The live scrape system is configured to operate a device including an operating system in which an instance of the first application executes. The live scrape system is configured to, responsive to the first query, and within the device, (i) navigate to the first application state in the instance of the first application and (ii) extract content from the instance of the first application. The content provider is configured to provide the extracted content to the user device for presentation to a user of the user device in real time.

22 Claims, 22 Drawing Sheets

(56) References Cited

U.S. PATENT DOCUMENTS

| | | |
|---|---|---|
| 8,868,537 B1 | 10/2014 | Colgrove et al. |
| 9,002,821 B2 | 4/2015 | Chang et al. |
| 9,135,346 B2 | 9/2015 | Chang |
| 9,311,168 B1 | 4/2016 | Lewis et al. |
| 9,448,776 B1 | 9/2016 | Sankaran et al. |
| 9,495,444 B2 | 11/2016 | Shapira et al. |
| 9,766,861 B2 | 9/2017 | Savliwala et al. |
| 2004/0193574 A1 | 9/2004 | Suzuki |
| 2007/0208713 A1 | 9/2007 | Krishnaprasad et al. |
| 2007/0208755 A1 | 9/2007 | Bhatkar et al. |
| 2011/0083167 A1 | 4/2011 | Carpenter et al. |
| 2012/0124061 A1 | 5/2012 | Macbeth et al. |
| 2012/0290441 A1* | 11/2012 | Mahaniok ................ G06F 8/60 705/26.62 |
| 2012/0317187 A1 | 12/2012 | Fredricksen et al. |
| 2013/0166525 A1 | 6/2013 | Naranjo et al. |
| 2014/0040231 A1 | 2/2014 | Lin |
| 2014/0250106 A1 | 9/2014 | Shapira et al. |
| 2014/0250147 A1* | 9/2014 | Shapira ............. G06F 17/30864 707/770 |
| 2015/0066886 A1 | 3/2015 | Wu et al. |
| 2015/0154644 A1 | 6/2015 | Saxena et al. |
| 2015/0363368 A1 | 12/2015 | Zhang et al. |
| 2015/0370810 A1 | 12/2015 | Chen et al. |
| 2015/0370812 A1 | 12/2015 | Lee et al. |
| 2016/0142859 A1 | 5/2016 | Molinet et al. |
| 2016/0188720 A1 | 6/2016 | Schlesinger et al. |
| 2016/0203002 A1 | 7/2016 | Kannan et al. |
| 2016/0234330 A1 | 8/2016 | Popowitz et al. |
| 2016/0321052 A1 | 11/2016 | Sharifi et al. |
| 2016/0357831 A1 | 12/2016 | Linn et al. |

OTHER PUBLICATIONS

A U.S. Office Action dated Jan. 4, 2019, issued in the U.S. Patent and Trademark Office with related U.S. Appl. No. 14/981,300.

* cited by examiner

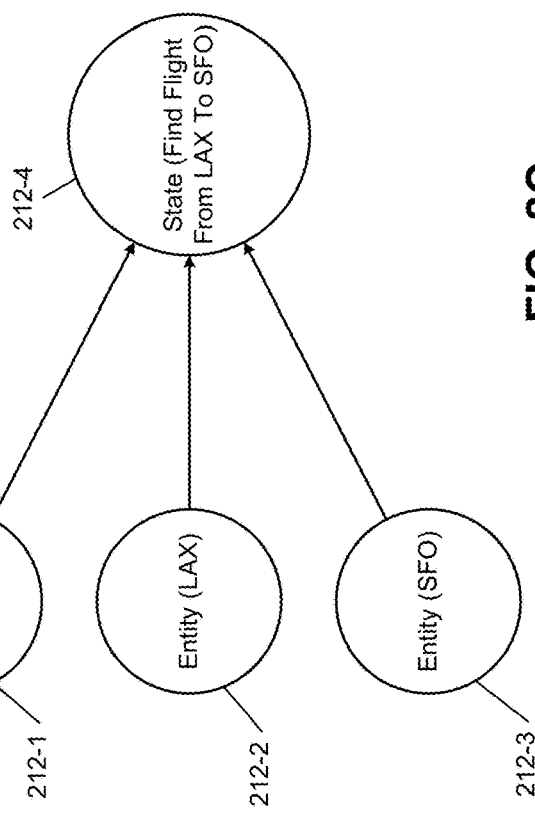
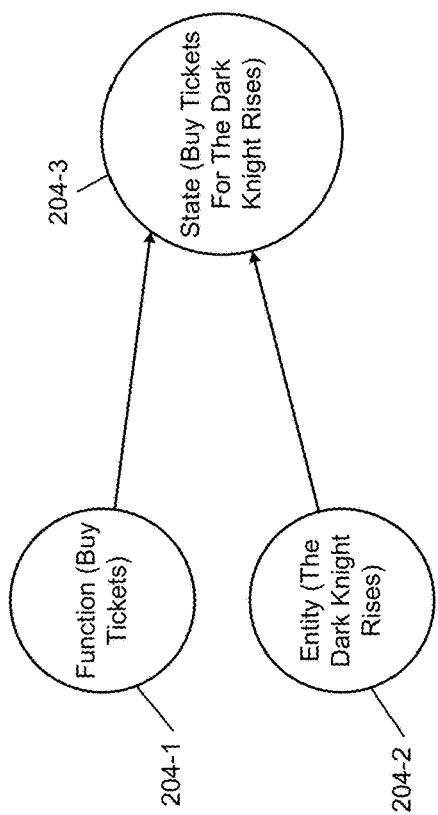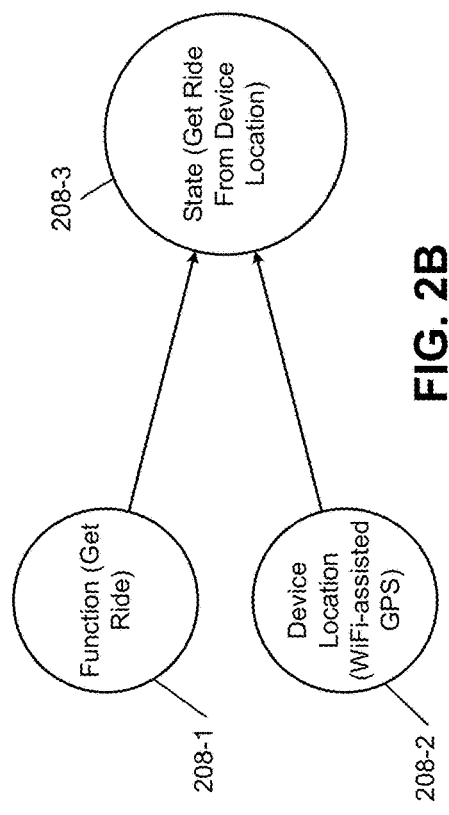

CLOUD-ENABLED ARCHITECTURE FOR ON-DEMAND NATIVE APPLICATION CRAWLING

CROSS-REFERENCE TO RELATED APPLICATIONS

This application claims the benefit of U.S. Provisional App. No. 62/204,974, filed on Aug. 13, 2015. The entire disclosure of the application referenced above is incorporated by reference.

FIELD

The present disclosure relates to crawling apps for content, and more particularly to crawling mobile apps for content.

BACKGROUND

Search engines are an integral part of today's world. A key component of a search engine is the collection of search indices that power the search. In the context of a search engine, a search index can be an inverted index that associates keywords or combinations of keywords to documents (e.g., web pages) that contain the keyword or combination of keywords. In order to generate and maintain these search indexes, most search engines use crawlers to identify documents and information within the documents. A traditional crawler requests a document from a content provider and the content provider provides the requested document to the crawler. The crawler then identifies and indexes the keywords and combinations of keywords in the document.

As the world transitions to a mobile-based architecture, the way content providers provide access to their content is changing. User devices can access content using a variety of different mechanisms. For example, user devices can obtain content from a content provider using a native app dedicated to accessing a software app of the content provider or a web browser that accesses the software app using a web browser. Furthermore, content providers may allow access to different content depending on the geographic region of a user device, the type of user device, the time of day, and/or the operating system of the user device. For these and other reasons, crawling has become an increasingly difficult task.

SUMMARY

A search system includes a query receiver, a live scrape system, and a content provider. The query receiver is configured to receive a first query related to a first application state of a first application. The first query is based on a user-requested search from a user device. The live scrape system is configured to operate a device including an operating system in which an instance of the first application executes. The live scrape system is configured to, responsive to the first query, and within the device, (i) navigate to the first application state in the instance of the first application and (ii) extract content from the instance of the first application. The content provider is configured to provide the extracted content to the user device for presentation to a user of the user device in real time.

In other features, the device comprises one of an emulator configured to execute the operating system on emulated hardware and a simulator configured to simulate interaction of the operating system with the first application. In other features, the live scrape system is configured to, responsive to the first query, and within the device, (i) navigate to the first application state in the instance of the first application, (ii) supply search parameters based on the first query to the first application state, (iii) initiate a search action from the first application state, and (iv) extract content from search results provided by the instance of the first application in response to the search action.

In other features, the search system includes a query understanding pipeline configured to parse the user-requested search and identify a set of entity types provided in the user-requested search. The first query is generated in response to the identified set of entity types from the user-requested search. In other features, the user-requested search includes a text string. The query understanding pipeline is configured to identify one or more substrings of the text string, each substring corresponding to an entity having a corresponding entity type.

In other features, the search system includes a rules-based search module configured to store a set of rules, each rule designating (i) an application, (ii) an application state of the designated application through which a search can be performed, and (iii) for each input parameter of the search, a type of entity that can be provided as the input parameter. The rules-based search module is configured to select a first rule from the set of rules based on a match between the designated entity types for the first rule and the identified set of entity types from the user-requested search. The rules-based search module is configured to generate the first query based on the first rule.

In other features, the extracted content is provided to the user device in a form of at least one deep view card (DVC). Each DVC of the at least one DVC includes content to be displayed to the user including an identification of the first application, an identification of the first application state, and information extracted from the first application state. In other features, the search system includes a DVC builder configured to format the extracted content into the at least one DVC. The search system includes a DVC template store configured to store a first template that specifies which portions of the extracted content correspond to fields in the at least one DVC.

In other features, the search system includes a query router configured to, responsive to the query receiver receiving a second query, (i) determine whether results data corresponding to the second query have been cached, (ii) in response to the results data having been cached, selectively provide the results data to the content provider, and (iii) in response to the results data not having been cached, selectively provide the second query to the live scrape system. In other features, the query router is configured to, responsive to the query receiver receiving the second query, selectively provide the second query to the live scrape system in response to the cached results data being out of date.

In other features, the search system includes a query router configured to, responsive to the query receiver receiving a second query, (i) in response to an application programming interface (API) being available for an application state specified by the second query, selectively provide the second query to an API passthrough to be serviced by the available API and (ii) in response to no API being available for the application state specified by the second query, selectively provide the second query to the live scrape system.

In other features, the search system includes a query router configured to, responsive to the query receiver receiving a second query, (i) in response to a web edition of an application state specified by the second query being available via HTTP (hypertext transfer protocol), selectively provide the second query to a web scrape system to be serviced by the available web edition and (ii) in response to no web edition being available for the application state specified by the second query, selectively provide the second query to the live scrape system.

A computer-implemented method includes receiving a first query related to a first application state of a first application. The first query is based on a user-requested search from a user device. The method includes operating a device including an operating system in which an instance of the first application executes. The method includes, responsive to the first query, and within the device, (i) navigating to the first application state in the instance of the first application and (ii) extracting content from the instance of the first application. The method includes providing the extracted content to the user device for presentation to a user of the user device in real time.

In other features, operating the device comprises one of operating an emulator configured to execute the operating system on emulated hardware and operating a simulator configured to simulate interaction of the operating system with the first application. In other features, the method includes, responsive to the first query, and within the device, (i) navigating to the first application state in the instance of the first application, (ii) supplying search parameters based on the first query to the first application state, (iii) initiating a search action from the first application state, and (iv) extracting content from search results provided by the instance of the first application in response to the search action.

In other features, the method includes parsing the user-requested search. The method includes identifying a set of entity types provided in the user-requested search. The first query is generated in response to the identified set of entity types from the user-requested search. In other features, the user-requested search includes a text string. The method includes identifying one or more substrings of the text string. Each substring corresponds to an entity having a corresponding entity type.

In other features, the method includes storing a set of rules, each rule designating (i) an application, (ii) an application state of the designated application through which a search can be performed, and (iii) for each input parameter of the search, a type of entity that can be provided as the input parameter. The method includes selecting a first rule from the set of rules based on a match between the designated entity types for the first rule and the identified set of entity types from the user-requested search. The method includes generating the first query based on the first rule.

In other features, the extracted content is provided to the user device in a form of at least one deep view card (DVC). Each DVC of the at least one DVC includes content to be displayed to the user including an identification of the first application, an identification of the first application state, and information extracted from the first application state. In other features, the method includes formatting the extracted content into the at least one DVC. The method includes storing DVC templates including a first template. The first template specifies which portions of the extracted content correspond to fields in the at least one DVC.

In other features, the method includes, in response to receiving a second query, (i) determining whether results data corresponding to the second query have been cached, (ii) in response to the results data having been cached, selectively providing the cached results data to the user device, and (iii) in response to the results data not having been cached, selectively navigating to an application state based on the second query, extracting content, and providing the extracted content to the user device. In other features, the selectively navigating to an application state based on the second query, extracting content, and providing the extracted content to the user device are performed in response to the cached results data being out of date.

In other features, the method includes, in response to receiving a second query corresponding to a second application, in response to an application programming interface (API) being available for an application state specified by the second query, selectively (i) preparing an API call, (ii) transmitting the API call to a backend server for the second application, and (iii) providing content to the user device based on a response to the API call from the backend server. The method includes, in response to receiving a second query corresponding to a second application, in response to no API being available for the application state specified by the second query, selectively navigating to an application state based on the second query, extracting content, and providing the extracted content to the user device.

In other features, the method includes, in response to receiving a second query corresponding to a second application, in response to a web edition of the second application being available, selectively (i) sending an HTTP (hypertext transfer protocol) request to a backend server for the second application, (ii) receiving an HTTP response from the backend server, (iii) scraping data from the HTTP response, and (iv) providing content to the user device based on the scraped data. The method includes, in response to receiving a second query corresponding to a second application, in response to no web edition being available for the second application, selectively navigating to an application state based on the second query, extracting content, and providing the extracted content to the user device.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIGS. 2A-2C are graphical representations depicting app states as combinations of functions and entities.

In the drawings, reference numbers may be reused to identify similar and/or identical elements.

DETAILED DESCRIPTION

In order to present content from mobile applications (referred to interchangeably as "apps"), a search system generally crawls and scrapes the mobile apps to extract the content and index the content. This requires significant resources, both at the time of incorporating a new app into the search system as well as when updating the search system to acquire additional or changed content from the app. The expense may be in terms of human operator time, processing time, and storage space.

Some apps may present application programming interfaces (APIs), which can be queried by the search system to retrieve results in real time. By obtaining results in real time, upfront processing and storage costs can be reduced. However, many apps do not present APIs accessible to a third party. As a result, these apps are currently crawled, scraped, stored, and indexed. Further, some apps have no static content to be scraped. Search results related to these apps may therefore be lacking rich content.

Figure 1A:
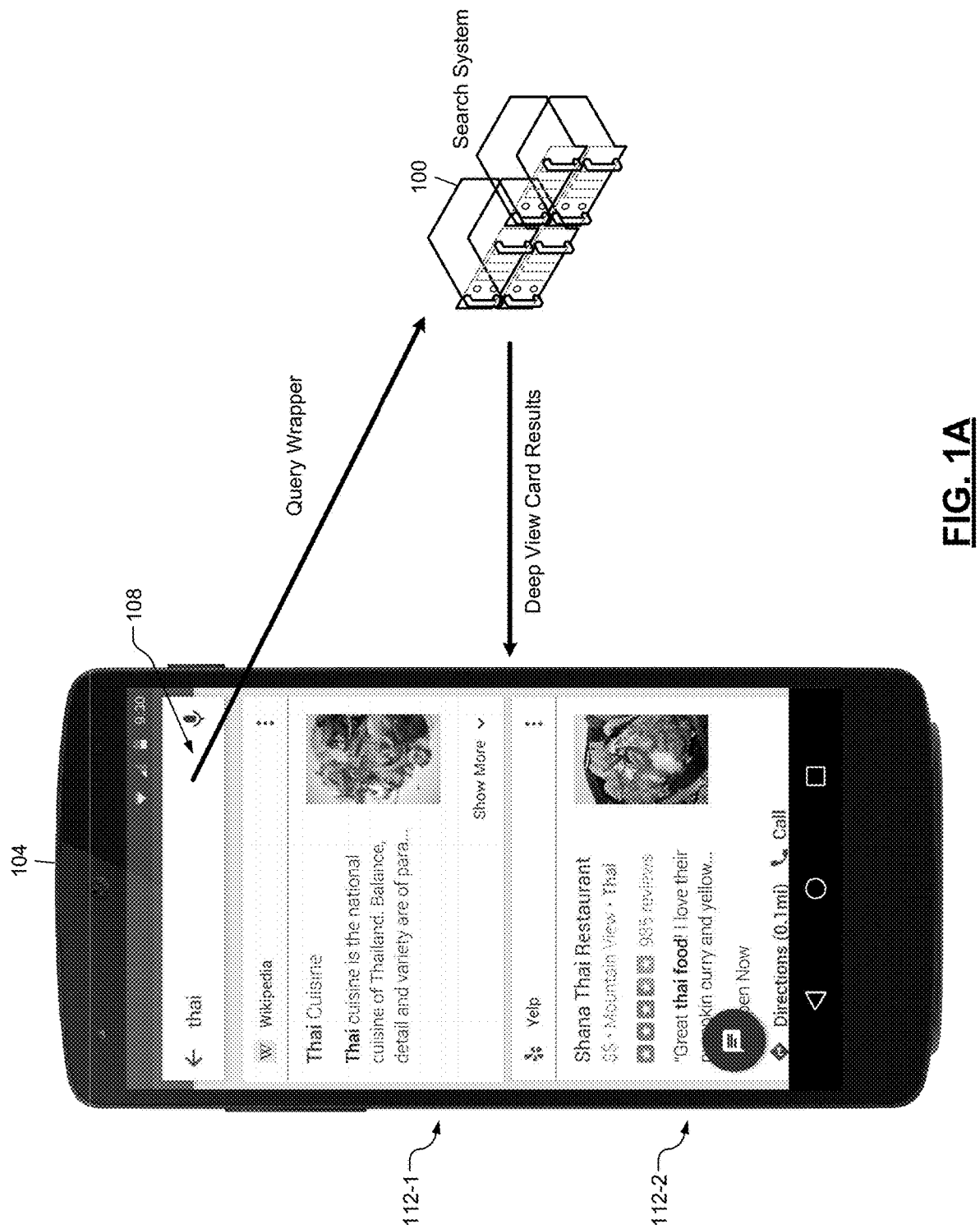
FIG. 1A is an example of a graphical user interface according to the principles of the present disclosure.

For example only, in FIG. 1A, a search system 100 is shown providing results to a device 104. The device 104 is shown as a smartphone, but could be any other type of user device, such as a laptop, tablet, smartwatch, or desktop computer. A query of "thai" is received from a user via text box 108 sent from the device 104 to the search system 100 within a query wrapper. Results, commonly referred to as deep view cards, are returned by the search system 100 to the device 104.

The results indicate apps and specific states (or, screens) of apps that are relevant to the user's query. As described below, the user's query may be based on other inputs than a text box. For example, the user's query may be inferred from a button press, or from other interaction with the user interface. Further, queries may be generated by another service on behalf of the user, such as by a search aggregator platform that provides search results from various search systems.

As seen in FIG. 1A, the device 104 displays rich search results based on the WIKIPEDIA online encyclopedia app and the YELP restaurant review app. The rich information presented is referred to as a deep view card (DVC). A DVC will show more than the identification of the app or app state, and will instead include other metadata.

For example, the metadata may include a title of the app state, or a description of the app state, which may be a snippet of text from the app state. Other metadata may be provided from the app state, including images, location, number of reviews, average review, and status indicators. For example, a status indicator of "open now" or "closed" may be applied to a business depending on whether the current time is within the operating hours of the business.

Another feature of some DVCs may be that information (such as text) that led to the DVC being selected as a search result may be highlighted. In the example of FIG. 1A, the word "Thai" is shown in bold.

The DVC may also include direct actions, such as the ability to call an establishment or to get navigation directions to the establishment. Other interactions with the DVC may take the user to the indicated state. As described in more detail below, this may be accomplished by opening the relevant app or, if the app is not installed, opening a website related to the desired app state. In other implementations, an app that is not installed may be downloaded, installed, and then executed in order to reach the desired app state.

In other words, a DVC includes an indication of the app state as well as additional content from the app state itself. The additional content allows the user to make a more informed choice about which result to choose, and may even allow the user to directly perform an action without having to navigate to the app state. If the action the user wants to take is to obtain information, in some circumstances the DVC itself may provide the necessary information to accomplish such action.

Figure 1B:
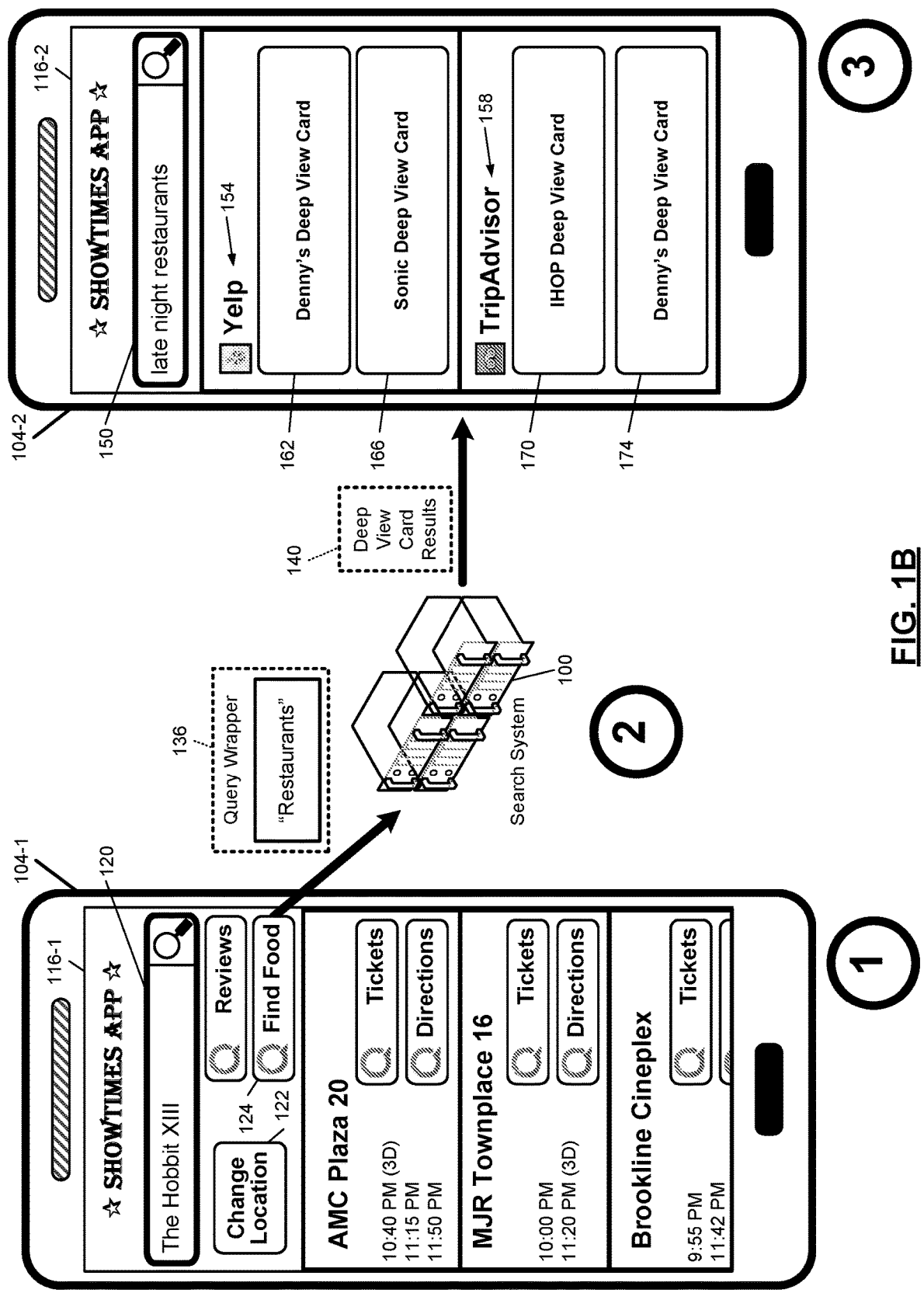
FIG. 1B is another example of a graphical user interface.

A DVC 112-1 for "Thai Cuisine" corresponds to the WIKIPEDIA app. In one nomenclature, the "Thai Cuisine" DVC is considered to be an element of a Wikipedia deep view (DV). In other words, a DV corresponds to an app and can include multiple DVCs. For example, outlines of multiple DVCs per DV are shown in FIG. 1B.

For example, the Wikipedia DV may include the DVC 112-1 for "Thai Cuisine" as well as a DVC for "Thai language." As another example, the Yelp DV may include DVCs for multiple restaurants. However, the UBER ride sharing app may have no static states that can be scraped. Instead, each DVC for an Uber DV corresponds to an available ride. Meanwhile, the DVCs for Wikipedia and Yelp may be static states that could be scraped with an investment of time, processing power, and memory storage.

As yet another example, the GASBUDDY gas station pricing app does not have static states and also does not offer a third party API. In order to provide DVC content for the GasBuddy app, the present disclosure implements on-demand app crawling. By executing the GasBuddy app within an emulator controlled by the search system 100, the content displayed by the GasBuddy app can be scraped on demand and provided as DVC content by the search system.

The emulator may be configured to provide context based on, for example, a location of the device 104. In other words, the GasBuddy app executing within an emulator may be told (such as by forcing the GPS coordinates or other location service of the emulator) that the emulator's location is the same as the present location of the device 104. In this way, the results generated by the GasBuddy app are relevant to the location of the device 104.

Similarly, an emulator can execute the WIKIPEDIA app, perform a search for "THAI," and provide DVC content obtained from the WIKIPEDIA app in real time. The term "real time" in this context generally requires that the delay between the user making a request and the results being returned is on the order of milliseconds or seconds, not tens of seconds, minutes, or hours. In other words, the user will not view the search app as unresponsive due to a long wait for results. Further, with the exception of caching, which may be available in some implementations for some searches, "real time" means that the results are procured directly in response to the request as quickly as possible and promptly displayed to the user.

In these respects, "real time" results differ from pre-scraped results that may be obtained ahead of time based on anticipated user queries. In other words, "real time" results are obtained from an app immediately following, and directly responsive to, a request from a live user who is expecting a prompt response to the query.

In FIG. 1B, an unsophisticated showtimes app 116 is shown running on the device 104. A first state of the showtimes app 116 is shown at 116-1 within a representation of the device 104-1. A second state of the showtimes app 116 is shown at 116-2 within a representation of the device 104-2. In the simple interface of the first state 116-1, a search bar 120 identifies a movie for which theater showtimes are being displayed (a fictional "The Hobbit XIII").

The first state 116-1 displays theaters and showtimes for theaters located near the present location of the device 104 but may allow the user to change the desired location using a "change location" button 122. A variety of functional search buttons are provided, including a "find food" 124. As an example only, a stylized "Q" may be displayed, which is associated with Quixey, Inc. of Mountain View, Calif.

When a user selects (such as by tapping their finger) the "find food" button 124, a query wrapper 136 is sent to the search system 100. The query wrapper 136 includes an indication that food results are desired, such as a text query of "restaurants." The search system 100 interprets the query, gathers results, and provides deep view card (DVC) results 140 to the showtimes app 116. These results are shown in the second state 116-2.

The search system 100 may contextualize the query based on data known to the search system 100 or provided by the device 104. For example, the search system 100 may recognize that the present local time where the device 104 is located is late evening and therefore perform a search for "late night restaurants." In addition, the search system 100 may provide results based on a location of the device 104. The location of the device 104 may be provided within the query wrapper 136 or may be determined in another way, such as based on IP geolocation.

In the second state 116-2, a query box 150 may indicate a textual representation of a performed query. Although the text shown reads "late night restaurants," the initial text query of "restaurants" may instead be shown. In other implementations, no indication of the query is visible. In various implementations, the query box 150 may allow a user to modify the query and perform a new search.

The DVC results 140 from the search system 100 include a deep view (DV) 154 for the YELP app and a DV 158 for the TRIPADVISOR travel review app. While not shown with the actual rich data placeholders for DVCs 162 and 166 are shown within the Yelp DV 154. The DVC 162 corresponds to a specific DENNY'S restaurant while the DVC 166 corresponds to a specific SONIC drive-in restaurant. The TripAdvisor DV 158 includes a DVC 170 for an IHOP restaurant and a DVC 174 for a Denny's restaurant, again shown only as outlines without the rich content generally present in DVCs. In various implementations, if the DVCs 162 and 174 are for the same Denny's restaurant, one of the DVCs 162 and 174 may be omitted from the displayed results to make room for other results (in this case, likely other restaurants).

Note that each of the DVs 154 and 158 includes multiple DVCs. Depending on quantity of search results, scores associated with the search results, and screen space, some DVs will have only a single DVC while some DVs may have more than two DVCs. For example, if the Yelp DV 154 was only provided with a single DVC, there may be additional room to display a third DVC for the TripAdvisor DV 158.

The order of the DVCs within the DV may be set based on an order established by the corresponding app. For example, the order of the DVCs 162 and 166 for the Yelp DV 154 may be in the same order in which the Denny's and Sonic locations would be shown when the search was performed within the Yelp app itself. In addition, the DVCs selected for presentation to the user of the showtimes app 116 may be the very first results within the Yelp app, indicating that the Yelp app considered those results to be most relevant.

In other words, the identity and order of the DVCs within a DV may be established by the app itself. Meanwhile, the ordering of the DVs within the presented search results may be based on a number of factors, including user engagement with an app (an app that receives more clicks when presented to the user may increase in the rankings) and reliability of the app (applications that historically return results less responsive to user queries may have decreased rankings).

Entities

In FIG. 2A, an example is presented of how functions and entities can be combined to arrive at app states. A function of "Buy Tickets" 204-1 and an entity of "The Dark Knight Rises" 204-2 combine to create a state 204-3 for buying tickets to "The Dark Knight Rises."

Similarly, in FIG. 2B, a function of "Get Ride" 208-1 and a location entity (such as WiFi-assisted GPS) of the device 208-2 combine to create a state 208-3 for getting ride/taxi from present location.

In FIG. 2C, a function "Find Flight" 212-1 combines with an entity "LAX" (Los Angeles Airport) 212-2 and an entity "SFO" (San Francisco Airport) 212-3 to create a state 212-4 for finding a flight from LAX to SFO. Note that the entities 212-2 and 212-3 in the final example may serve as either departure location or arrival location. If there is no indication of which entity is which, an alternative state (finding a flight from SFO to LAX) is possible.

Figure 3A:
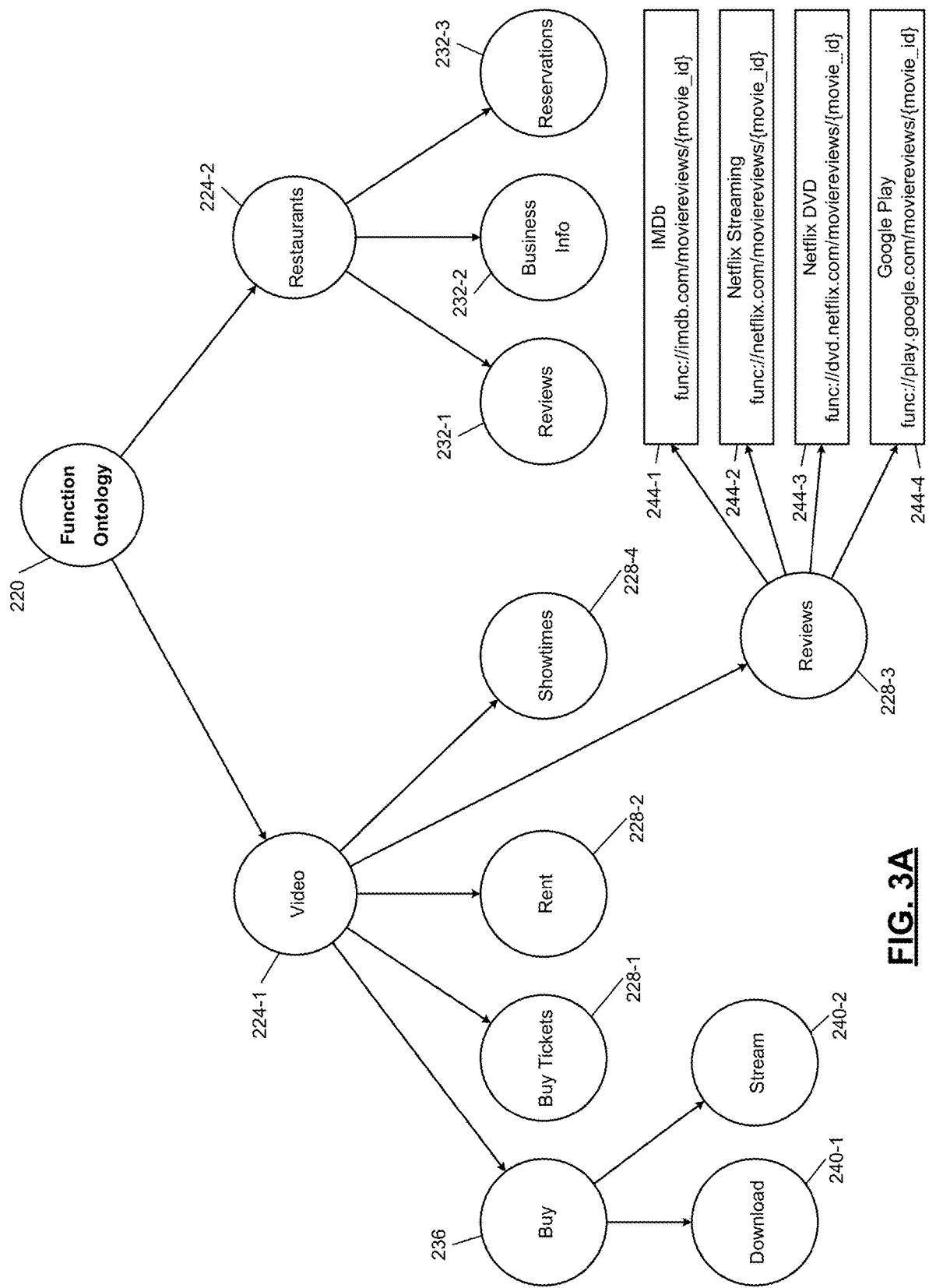
FIG. 3A is a graphical representation of an example functional ontology.

In FIG. 3A, a function ontology 220 includes a number of branch nodes (such as video 224-1 and restaurants 224-2), which may represent different industry verticals. The function ontology 220 includes leaf nodes (such as buy tickets 228-1, rent video 228-2, reviews 228-3, and showtimes 228-4) that each correspond to a particular function offered by one or more apps. Leaf nodes underneath the restaurants branch node 224-2 include reviews 232-1, business info (such as hours and address) 232-2, and reservations 232-3. Further branch nodes may be specified, such as a buy branch node 236 under which leaf nodes download 240-1 and stream 240-2 are specified. The rent leaf node 228-2 could be similarly expanded. Each of the functions of the function ontology 220 may be accomplished by a number of different apps. For example, video reviews 228-3 are available from, among many other sources, an IMDB app, a NETFLIX app, and a GOOGLE PLAY app.

Access templates may be determined for the functions of each app. An information triplet—the app, the function the app is to perform, and the entity for which the function will be performed—specifies a state. When this triplet is formatted as a URL (uniform resource locator), the URL may be termed a functional URL. Functional URLs may be used with a namespace "func://" to differentiate the functional URL from a standard web URL in the "http://" namespace. Action templates define what types and number of entities are required to specify a functional URL for a given app function.

Examples of access templates for video reviews 228-3 are shown at 244-1, 244-2, 244-3, and 244-4. The access template 244-1 for IMDb includes the namespace, "func://," an indication of the app, "imdb.com," a separator forward slash, an indication of the function to be performed, "movie reviews," another separator forward slash, and then an indicator of an entity type, which is a movie_id.

Therefore, in order to use the access template 244-1, a movie entity must be identified. Further, as described in more detail below, the identified movie entity must be applicable to IMDb. In general terms, this means that if the movie is not present in the IMDb app, the access template 244-1 will be irrelevant. In technical terms, when attempting to instantiate the access template 244-1, there will be no IMDb-specific information for that entity with which to populate the access template 244-1.

Figure 3B:
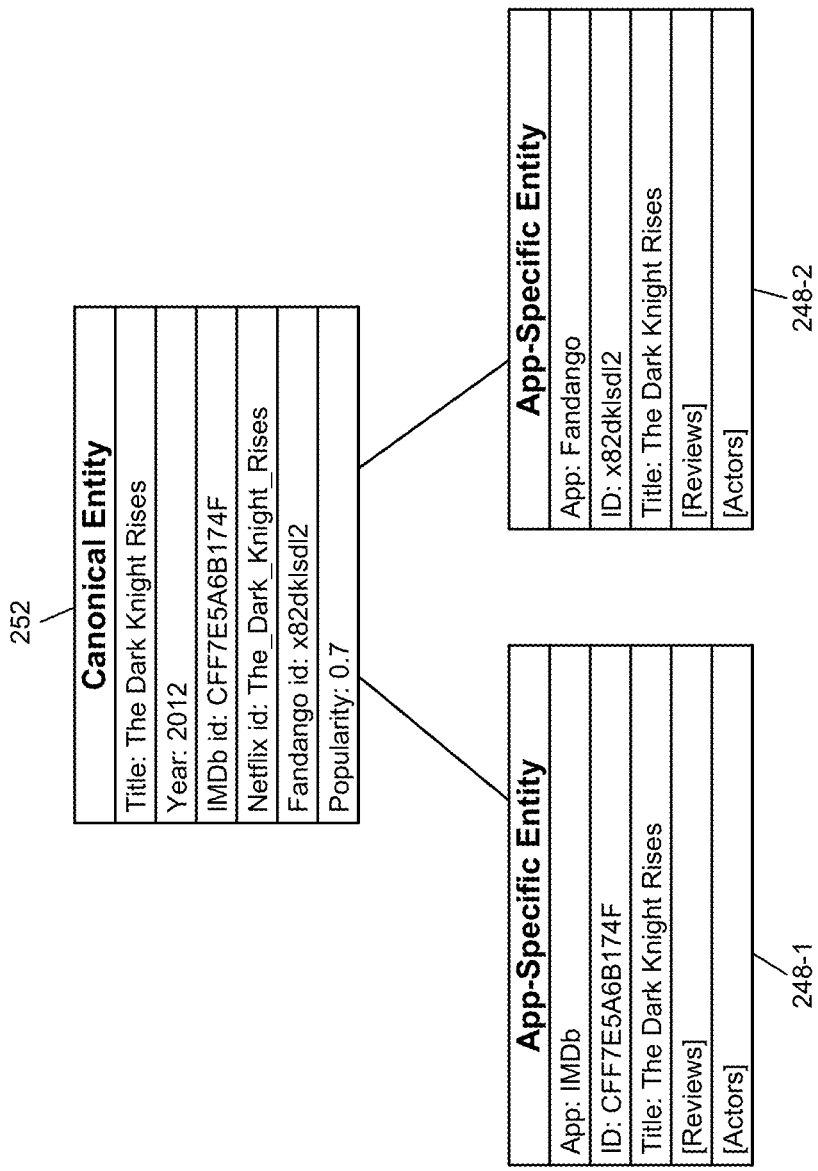
FIG. 3B is a simplified graphical example of linking application-specific entity information to a canonical entity.

In FIG. 3B, a brief example is shown of how a general (or canonical) entity relates to app-specific information. App-specific entities 248-1 and 248-2 are present in a data store of the search provider. They may be obtained from various data services as described in more detail below. The app-specific entity 248-1 for IMDb includes a hexadecimal identification code (a fictitious ID is shown as an example only) and the title used by IMDb. In addition, other information, such as reviews, actors, producers, etc., may be stored.

The app-specific entity 248-2 for Fandango includes an alphanumeric ID specific to Fandango (a fictitious ID is shown as an example only), and includes the title used by Fandango for the movie. Additional information may also be stored.

A canonical entity 252 includes a canonical title, which in this particular case is the same as the titles for the app-specific entities 248-1 and 248-2 are the same. If the titles in the app-specific entities 248-1 and 248-2 differed, one would have to be chosen as the canonical title; or, a canonical title different from both may be used.

A canonical year is included, which may be the same as year information stored in the app-specific entities 248-1 and 248-2. The canonical entity 252 includes links to the app-specific entities 248-1 and 248-2. These links may be in the form of unique key values, such as might be used in a relational database. Additionally or alternatively, specific IDs that match the IDs used in the app-specific entities 248-1 and 248-2 may be used to link the canonical entity 252 to the app-specific entities 248-1 and 248-2. In other implementations, the canonical entity may simply have fields for app-specific data, as opposed to links to distinct app-specific entities.

The canonical entity 252 may also include various metrics, such as a popularity score. This popularity score may be based on how popular the described entity is from the various data sources relied upon and may include information about how frequently the entity is selected when presented to the user. The popularity may be normalized to other entities of the same type, in the same genre, etc.

Figure 3C:
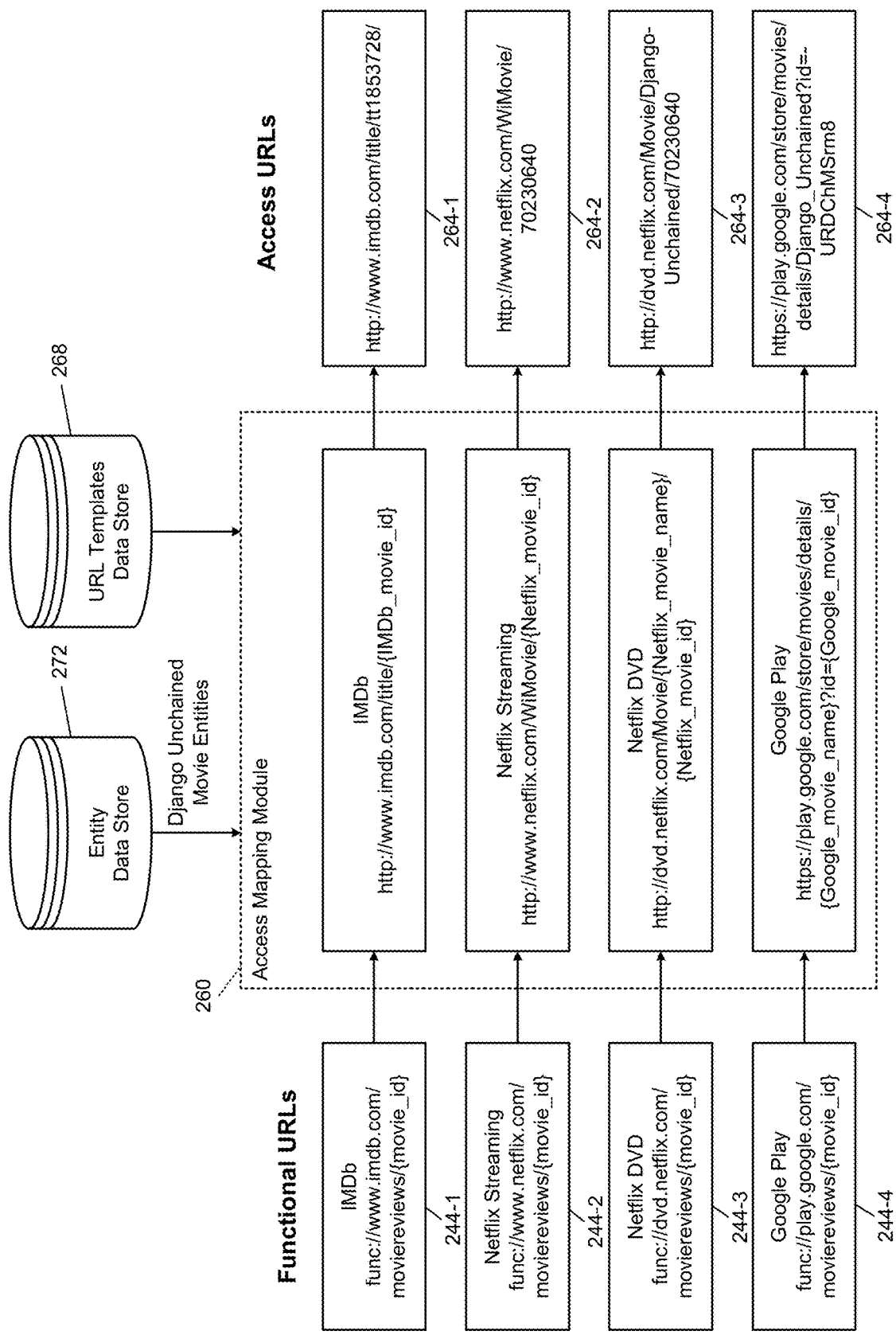
FIG. 3C is a graphical example of conversion from functional URLs to access URLs.

In FIG. 3C, an access mapping module 260 converts the functional URLs 244-1, 244-2, 244-3, and 244-4 into corresponding access URLs 264-1, 264-2, 264-3, and 264-4, respectively. The mapping is performed using access templates, which take specific information and insert it into a parameterized URL. Access templates are stored in a URL templates data store 268. An entity data store 272 stores information about entities, both canonical and app-specific.

As an example only, if the "movie_id" of the functional URLs 244 was a value corresponding to "Django Unchanged," a 2012 film, the access mapping module 260 would produce the access URLs 264 shown in FIG. 3C. Note that for the access URL 264-4, two app-specific values are retrieved from the entity data store 272: a Google-specific movie name and a Google-specific movie ID. Similar to the association shown in FIG. 3B, all of the app-specific data used to create the access URLs 264 is linked to a single "Django Unchained" canonical entity.

Dynamic States

Figure 4:
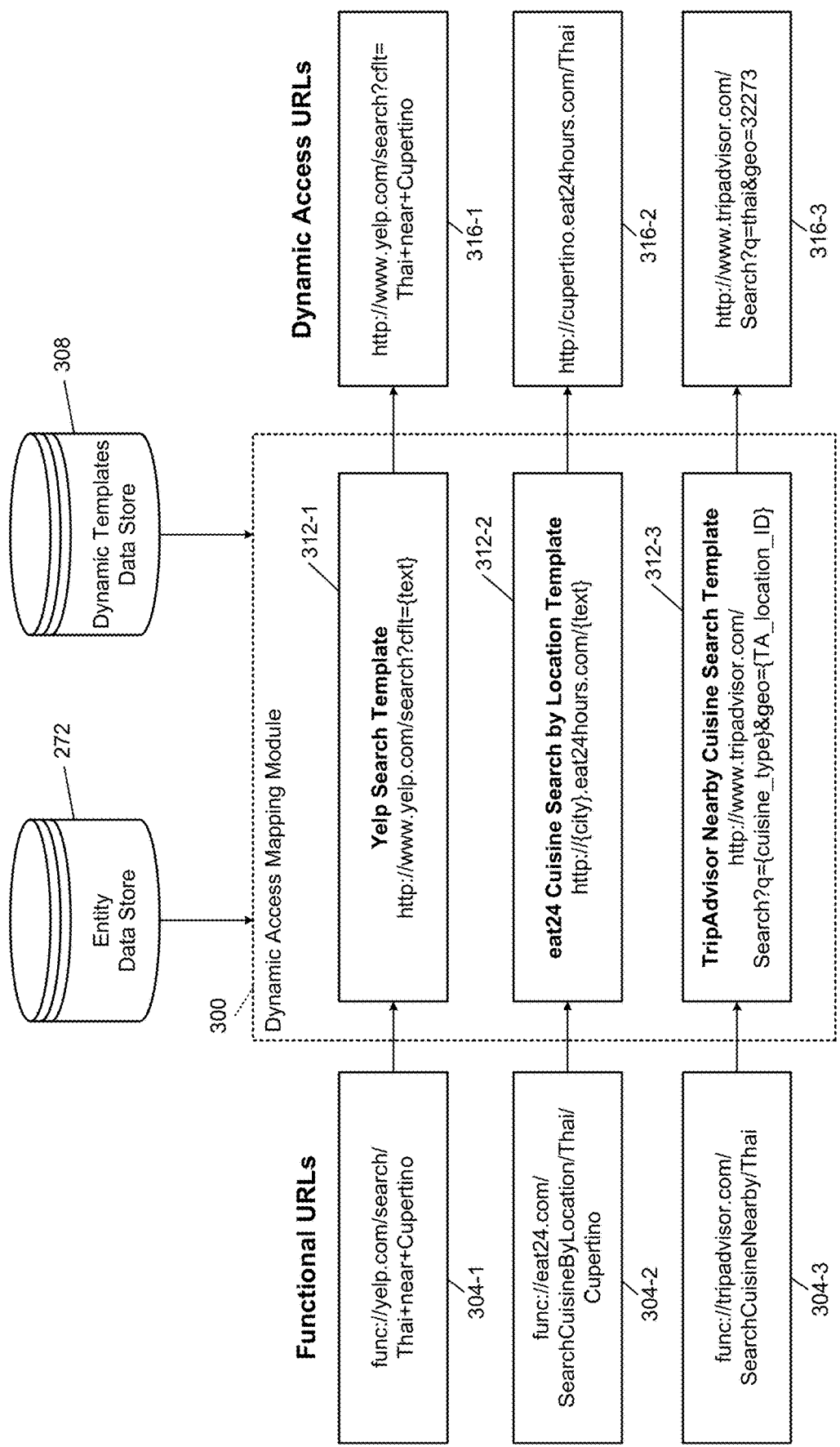
FIG. 4 is a graphical example of conversion from functional URLs to dynamic access URLs.

In FIG. 4, functional URLs that correspond to dynamic states are shown. These are URLs that don't correspond to static states, such as a specific movie or specific restaurant. As two examples, dynamic functional URLs may correspond to a state that provides search results of restaurants meeting a particular query or to a state that provides a list of movies meeting a particular query. As described in more detail below, these results can be scraped and converted into deep view cards for display to a user.

A dynamic access mapping module 300 receives functional URLs such as example functional URLs 304-1, 304-2, and 304-3. The dynamic access mapping module 300 relies on parameterized templates stored in a dynamic templates data store 308. These templates are parameterized, meaning that they are concatenations of segments of plain text as well as parameters whose values can be populated, similar to the format string of the printf( ) function in the C programming language.

In other words, a template designated by the functional URL is instantiated and populated with values provided by the functional URL. A Yelp search template 312-1 is identified by the functional URL 304-1 and results in a dynamic access URL 316-1. Note that the text string "thai near Cupertino," with spaces converted to plus signs, is filled into the {text} parameter of the template 312-1.

In another example, an eat24 cuisine search by location template 312-2 is instantiated using a text value of "thai" as well as a value "Cupertino" for the city parameter, both supplied by the functional URL. Alternatively, the value "Cupertino" may be determined based on a location of the device that sent the query. For example, IP geolocation and/or explicit location information from the device may be used to determine the location of the device. From that location, a city may be selected from the entity data store 272 to populate the city parameter of the eat24 template 312-2. The resulting dynamic access URL is shown at 316-2.

A TripAdvisor nearby search by cuisine template 312-3 is instantiated using a value of "thai" for the cuisine_type parameter. In addition, a location ID unique to TripAdvisor is selected from the entity data store 272. This results in dynamic access URL 316-3. The entity data store 272 may store lists of common entity types, such as zip codes, cities, counties, states, cuisine types, etc. The template 312-1 and 312-2 both allow a plaintext representation of cuisine to be supplied. Meanwhile, the template 312-3 uses cuisine_type, which may correspond to a list of cuisine types in the entity data store 272.

In other examples, the list of cuisine types may be unique to the app, in which case the entity data store 272 may store a list of app-specific cuisine types. The app-specific cuisine-type corresponding to the cuisine supplied by the functional URL may be determined and used to instantiate the template. Because the function for the functional URL 304-3 is a nearby search, the location may be supplied by the dynamic access mapping module 300 even though the functional URL 304-3 does not specify a specific location.

The dynamic access URLs 316 may also be referred to as search function URLs (SFURLs), because they access the search functionality of an app. Although displayed in FIG. 4 for illustration purposes as having human-readable and semantically-descriptive content, some (or, in various implementations, all) SFURLs may actually carry little or no semantic content. Instead, an SFURL may simply be a serialized machine-readable data structure for interpretation by the query system.

The present disclosure, instead of relying on access URLs or dynamic access URLs to access web editions of apps, accesses the apps themselves either on physical devices or on emulators. Because apps cannot always be launched to a specific state simply with a URL or other URI (Uniform Resource Identifier), the search system of the present application may navigate to a desired state with a combination of intent calls and user interface (UI) injection. The term "intent" is generally associated with the ANDROID operating system, but is used in this disclosure simply to refer to a programmatic approach to reaching a specific state. Corresponding elements for the IOS operating system may be referred to as view controllers.

UI replay may be used to simulate a user tapping or making other gestures in an app as well as for supplying data, such as text normally entered by a user through a soft keyboard. In various implementations, UI replay may be accomplished using an accessibility framework provided by the operating system or by a search-enabled app. Some states may be reached by a combination of intent invocation and UI replay. For example, an intent may be invoked to arrive at a search state and then UI replay simulates a user typing text and clicking a search button.

The information for some apps is not feasible to crawl or index, meaning that such a task is too expensive in terms of processing or storage resources, on the part of the search system and the infrastructure supporting the queried app. An on-demand system may have knowledge of entities available for each app, such as is shown in FIG. 3C. In such cases, the on-demand system may navigate to a particular state of an app and extract the content of that state in order to provide a result to a user.

In other implementations, one or more apps may not have been crawled or scraped and, therefore, the search system does not know about states that may be relevant to a search query. As a result, dynamic access, such as shown in FIG. 4, may be used. In these situations, parameterized templates may be specified when incorporating an app into the search system. This process may be referred to as onboarding. During the onboarding process, configurators (which may include human operators and/or automated algorithms) identify what searches can be performed in an app and what types of entity data is specified in that search. For example, when onboarding a hypothetical restaurant review app, one template may be a search based on cuisine type. Therefore, the entity type for the one parameter of this template (similar to the template 312 of FIG. 4) is cuisine.

As described in more detail below, when a user performs a text-based query, a query parser may attempt to identify which entity types are indicated by the query. Once the search system has identified which entity types have been provided in the query, the search system can identify which templates are available that can be instantiated using those entity types. Matching parameterized templates are then used to obtain results for the user's query. As described in more detail below, some of those results may be obtained by doing web queries such as are shown at 316 in FIG. 4. Other results are provided by accessing an app executing within an emulator, navigating to the corresponding state, and performing the search within that state. Results from the search are then selectively provided back to the user.

APP State Records

While the above description characterizes app states as an intersection of action (or, function) and entity, app states can instead be indexed in a single-level hierarchy, where each app state corresponds to an app state record. Some search systems may index app states as individual records while other search systems may employ the action/entity model. In other implementations, some apps may lend themselves better to the flat app state record model, and the search system may use both models. As described in the following paragraphs, an app state record may include metadata specifying the function or functions that can be performed using the app state, indicating the similarities between the two representations.

If an app state has already been crawled so as to populate an app state record in a data store (such as a database) of the search system, the ability to perform an on-demand crawl of the app state may be less important. However, for app states whose contents change frequently and/or unpredictably, an on-demand crawl may be the best way of providing up-to-date data to a user.

Figure 5B:
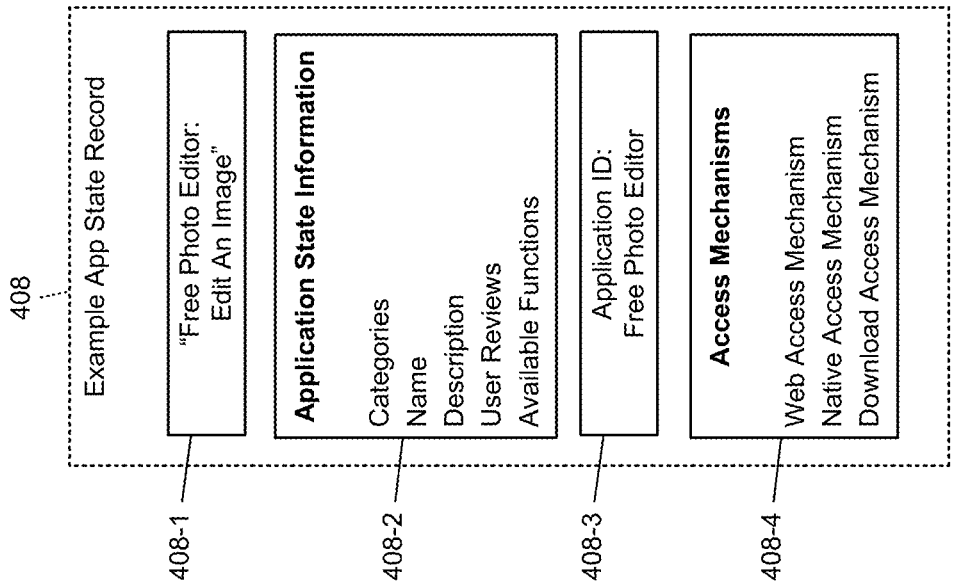
FIG. 5B is a graphical representation of an example app state record according to the format of FIG. 5A.
Figure 5A:
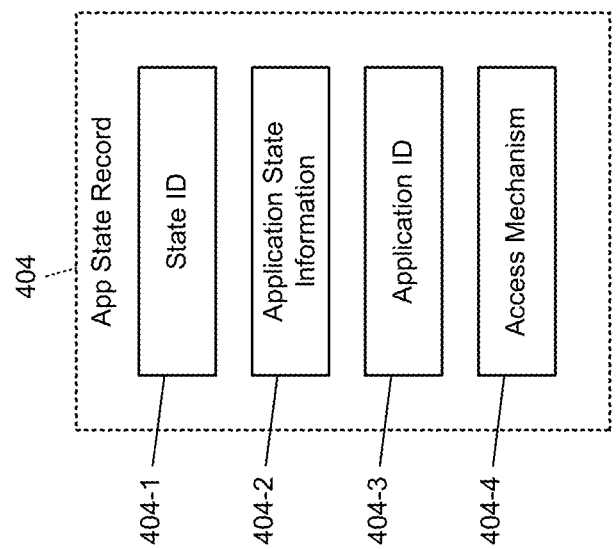
FIG. 5A is a graphical representation of an example app state record format.

In FIG. 5A, an example format of an app state record 404 includes a state identifier (ID) 404-1, app state information 404-2, an app identifier (ID) 404-3, and one or more access mechanisms 404-4 used to access the app state.

The state ID 404-1 may be used to uniquely identify the app state record 404 among the other app state records included in a data store. In some examples, the state ID 404-1 describes a function and/or an app state in human-readable form. For example, the state ID 404-1 may include the name of the app referenced in the access mechanisms 404-4.

In a specific example, a state ID 404-1 for an Internet music player app may include the name of the Internet music player app along with the song name that will be played when the Internet music player app is set into the state defined by the access mechanism 404-4 included in the app state record 404. In some examples, the state ID 404-1 includes a string formatted similarly to a uniform resource locator (URL), which may include an identifier for the app and an identifier of the state within the app. In other implementations, a URL used as the state ID 404-1 may include an identifier for the app, an identifier of a function to be provided by the app, and an identifier of an entity that is the target of the function.

The app state information 404-2 may include data that describes an app state into which an app is set according to the access mechanisms 404-4 in the app state record 404. The types of data included in the app state information 404-2 may depend on the type of information associated with the app state and the functionality specified by the access mechanisms 404-4. The app state information 404-2 may include a variety of different types of data, such as structured, semi-structured, and unstructured data.

The app state information 404-2 may be automatically and/or manually generated and updated based on documents retrieved from various data sources. For example, the data sources may include app developers' websites, data feeds provided by developers, digital distribution platforms, blogs, app review websites, social networking sites, and online databases.

In some examples, the app state information 404-2 includes data presented to a user by an app when in the app state corresponding to the app state record 404. For example, if the app state record 404 is associated with a music player app, the app state information 404-2 may include data that describes a song (e.g., name and artist) that is displayed and/or played when the music player app is set to the specified app state.

When the app state record 404 corresponds to a default state of an app, the app state information 404-2 may include information generally relevant to the app and not to any particular app state. For example, the app state information 404-2 may include the name of the developer of the app, the publisher of the app, a category (e.g., genre) of the app, a text description of the app (which may be specified by the application's developer), and the price of the app. The app state information 404-2 may also include security or privacy data about the app, battery usage of the app, and bandwidth usage of the app. The app state information 404-2 may also include app statistics, such as number of downloads, download rate (for example, average downloads per month), download velocity (for example, number of downloads within the past month as a percentage of all-time downloads of the app), number of ratings, and number of reviews.

The app ID 404-3 uniquely identifies an app associated with the app state record 404. The access mechanisms 404-4 specify one or more ways that the state specified by the app state record 404 can be accessed. For any given user device, only some of the access mechanisms 404-4 may be relevant.

For illustration, in FIG. 5B an example app state record 408 includes a state ID 408-1 in the form of human-readable text: "Free Photo Editor: Edit An Image." The example app state record includes app state information 408-2, including app category, state name, text description, user reviews (numerical and/or text), and available functions. For example, the available functions for this state may include cropping the image, rotating the image, and removing red eye.

An app ID 408-3 uniquely identifies the Free Photo Editor app. The app ID 408-3 may refer to a canonical Free Photo Editor software product that encompasses all of the editions of the Free Photo Editor app, including all the native versions of the Free Photo Editor app across platforms (for example, the IOS operating system and the ANDROID operating system) and any web editions of the Free Photo Editor app.

There are three access mechanisms 408-4 shown: a web access mechanism, a native app access mechanism, and a native download access mechanism. The web access mechanism may take the form of a URL (uniform resource locator) that corresponds to a web page for "Edit An Image" on the Free Photo Editor website.

The native access mechanism may include an app resource identifier for the native edition of the Free Photo Editor app on a particular operating system and one or more operations that navigate to the state in the Free Photo Editor app for the Edit An Image state. In various implementations, and for various app states, an access mechanism may be able to directly access the state (such as by using an ANDROID operating system intent). If the Free Photo Editor: Edit An Image app state is available on multiple operating system platforms, there would generally be multiple native access mechanisms.

The download access mechanism may include instructions to open a portal to a digital distribution platform to download and install the app, followed by opening the app and navigating to the correct state, at which point the opening and the navigating may be the same as the native access mechanism. In other words, the actions taken by the download access mechanism may be a superset of those of the native access mechanism.

APP Records

In some implementations, app results may be returned in addition to app state results. For example, if the user appears to have provided only an action with no specified entity, identifying applications that can perform that action may be more helpful than providing results to specific instances of those functions in an app. Further, when an app state or a dynamic search cannot be identified for a user query, one or more relevant apps may provide the functionality the user is looking for.

Figure 6B:
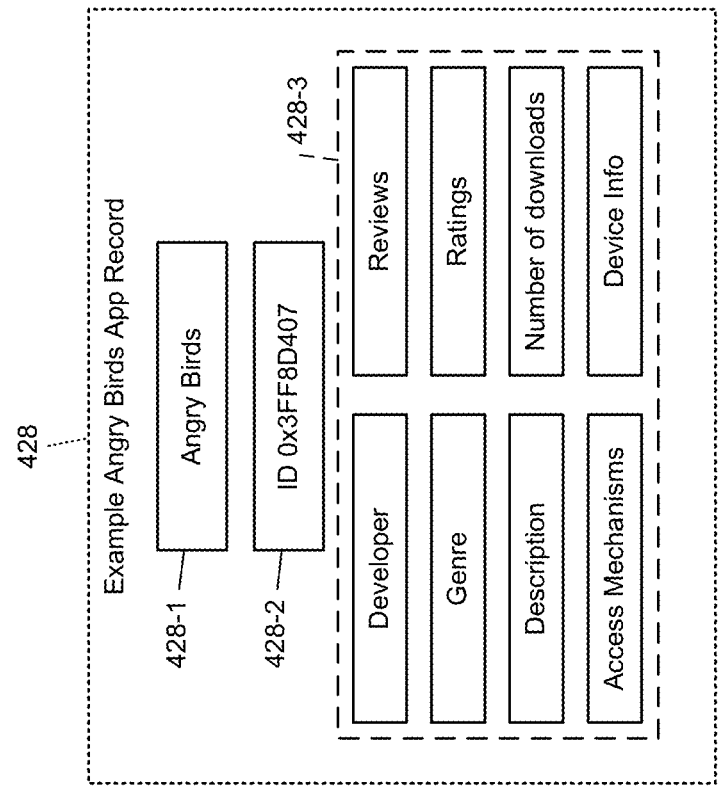
FIG. 6B is a graphical representation of an example app record according to the format of FIG. 6A.
Figure 6A:
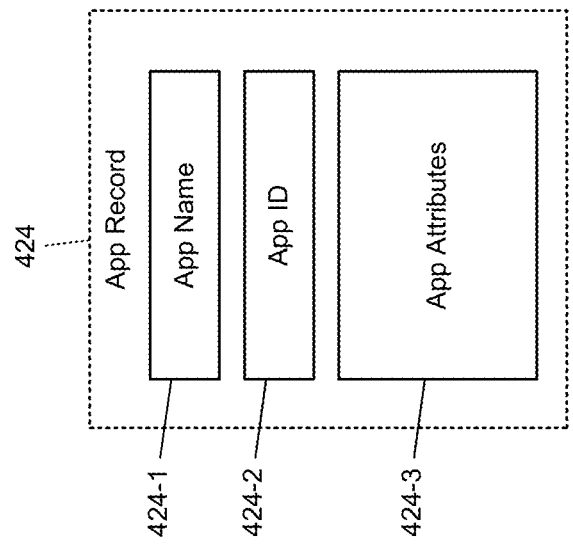
FIG. 6A is a graphical representation of an example app record format.

In FIG. 6A, an example format of an app record 424 includes an app name 424-1, an app identifier (ID) 424-2, and app attributes 424-3. The app record 424 generally represents data relevant to a data store for a specific app. A data store may include thousands or millions of records having the structure specified by the app record 424. The app ID 424-2 uniquely identifies an app in the data store. The app ID 424-2 may be assigned by the search system 100 and may therefore be independent of any ID assigned by, for example, a digital distribution platform.

A single value for the app ID 424-2 may cover multiple app editions. The term "edition" applies to multiple versions of a single software product and may also apply to versions of that software product released for alternative operating systems. For example only, Angry Birds (as shown in FIG. 6B) may be available on Android and iOS mobile device platforms and, for each platform, may have a series of versions as bug fixes are released and as the app is updated to take advantage of, and to adapt to, newer versions of operating system. For some or all of the states, the software product may also have a web edition, which may be accessed using a browser.

In FIG. 6B, an example app record 428 for an ANGRY BIRDS app includes a name 428-1 of "Angry Birds" and a unique ID 428-2 expressed in hexadecimal as 0x3FF8D407. Attributes 428-3 for Angry Birds may include a name of the developer of Angry Birds, text reviews of Angry Birds, a genre indicator for Angry Birds (such as "Games," or sub-genre "Physics-Based Games"), ratings (such as star ratings) for Angry Birds, a textual description (which may be provided by the developer), a number of downloads (which may be restricted to the most recent edition or could be for all editions), access mechanisms (how to open Angry Birds when already installed or how to install Angry Birds when not yet installed), and device info (for example, minimum requirements of operating system, hardware, and resolution for best operation).

In some examples, a single software product can provide more than one function. For example, a restaurant reservation app may also allow a user to read user reviews for a restaurant in addition to making reservations. As another example, a media player app may also allow a user to perform searches for digital media, purchase digital media, generate media playlists, and share media playlists.

The functions of a software product may be accessible using native app editions of the software app and/or web app editions of the software app. A native edition (or, "native application") is, at least in part, installed on a user device. In some scenarios, a native app is installed on a user device, but accesses an external resource (e.g., a database server) to obtain data from the external resource. For example, social media apps, weather apps, news apps, and search apps may respectively be accessed by one or more native apps that execute on various user devices.

In other scenarios, a native app is installed on the user device and does not access any external resources. For example, some gaming apps, calendar apps, media player apps, and document viewing apps may not require a connection to a network to perform a particular function. In these examples, the functionality of the software product is encoded in the native app itself.

Web editions (also referred to as "web applications") of a software may be partially implemented by a user device (such as by a web browser executing on the user device) and partially implemented by a remote computing device (such as a web server or app server). For example, a web app may be an app that is implemented, at least in part, by a web server and accessed by a web browser native to the user device. Example web apps include web-based email, online auctions websites, social-networking websites, travel booking websites, and online retail websites. A web app accesses functions of a software product via a network.

When rendering a set of app search results, a user device displays a set of user-selectable links that can be selected by a user of the user device. A user-selectable link may include one or more underlying access mechanisms. A user-selectable link, when selected by a user, causes the user device to access a software product using an edition of the software app identified by the access mechanism.

Examples of access mechanisms include native access mechanisms, web access mechanisms, download access mechanisms, and scripts. A native access mechanism may be a string that includes a reference to a native app and indicates one or more operations for the user device to perform. If a user selects a user selectable link including the native access mechanism, the user device may launch the corresponding native app.

In some implementations, any combination of the operating system of the user device, a search app executed by the user device, a native app executed by the user device, and/or a web browser executed by the user device can launch the native app referenced in the native access mechanism.

A web access mechanism may be a resource identifier that includes a reference to a web resource (e.g., a page of a web application/website), such as a uniform resource locator (URL) used with hypertext transfer protocol (HTTP). If a user selects a user-selectable link including a web access mechanism, the user device may launch a web browser app and may pass the resource identifier to the web browser.

An app download access mechanism may indicate a location (such as a digital distribution platform) where a native app can be downloaded in the scenario where a native app edition of the app is not installed on the user device. If a user selects a user-selectable link including an app download access mechanism, the user device may access a digital distribution platform from which the referenced native app edition may be downloaded. The user may opt to download the native app edition. Upon installation, the user device may automatically launch the native app edition.

A script access mechanism is a set of instructions that, when executed by the user device, cause the user device to access a resource indicated by the script. For example, the script may instruct an operating system of the user device to: launch a digital distribution platform interface app; browse to the specified native app within the digital distribution platform interface app; install the specified native app; and then open the specified native app.

Block Diagrams

Figure 7A:
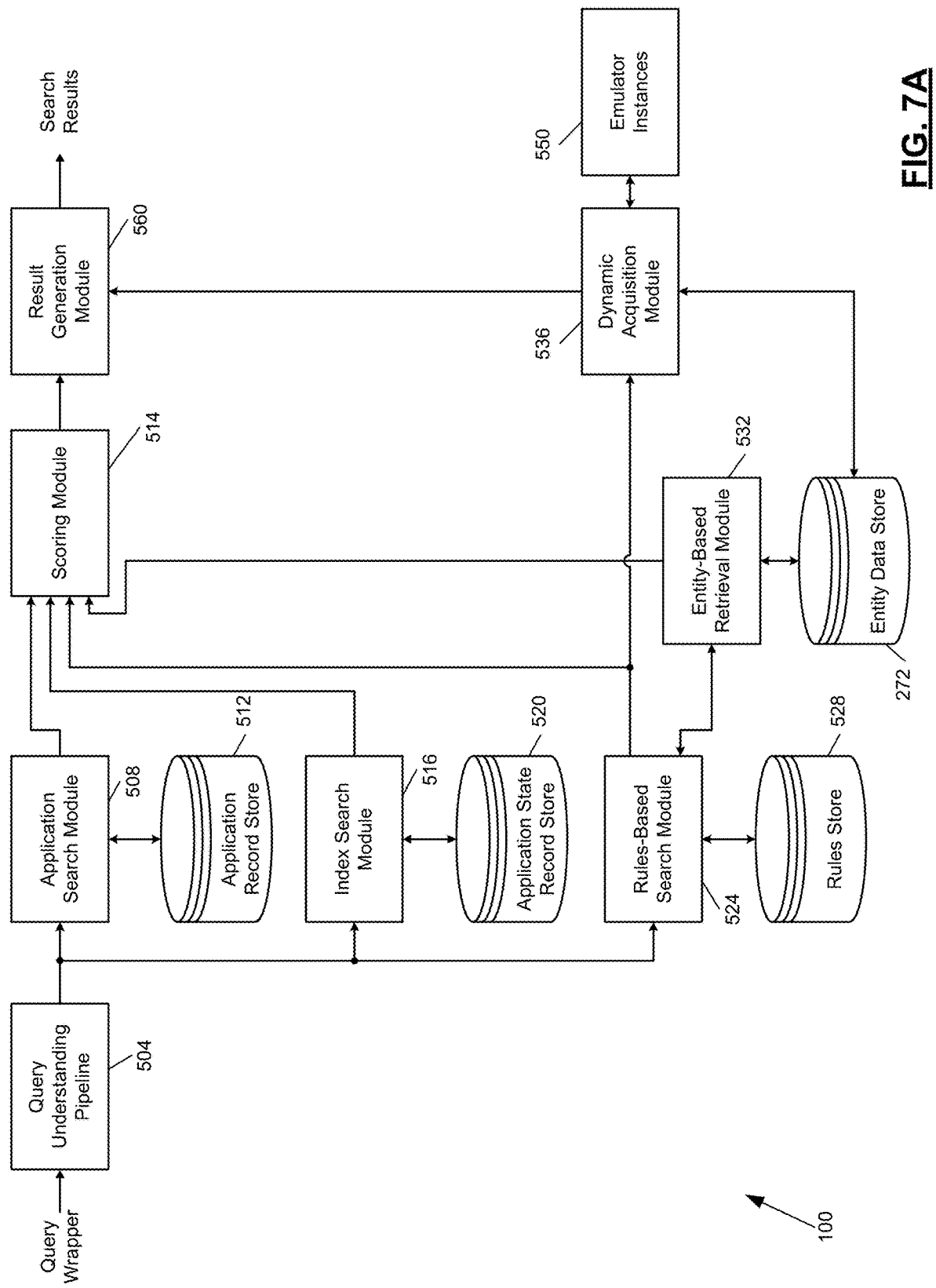
FIGS. 7A-7B are block diagrams of example implementations of a search system according to the principles of the present disclosure.

In FIG. 7A, an example implementation of the search system 100 includes a query understanding pipeline 504 that receives the query wrapper and parses the query to determine search tokens and infer the intent of the query. For example only, see commonly-assigned U.S. patent application Ser. No. 14/566,283, filed Dec. 10, 2014, titled "Rules-Based Generation of Search Results," with first-named inventor Michael Harris, the entire disclosure of which is incorporated by reference. See also commonly-assigned U.S. Provisional App. No. 62/179,674, filed May 13, 2015, titled "Application Search System," with first-named inventor Leigh Klotz, the entire disclosure of which is incorporated by reference.

The query understanding pipeline 504 may provide one or more query parses to an app search module 508, which may identify apps relevant to the query parses from an app record store 512. For example, records in the app record store 512 may have a format similar to that of the app record 424 of FIG. 6A.

The query understanding pipeline 504 may also provide one or more query parses to an index search module 516. The index search module 516 consults an app state record store 520, which may store app records consistent with the format of FIG. 5A. The index search module 516 may operate based on text indices, such as inverted indices, and may use metrics such as TF-IDF (term frequency—inverted document frequency) in determining matches between a query parse and an app state. Selected app states are provided to a scoring module 514. Similarly, selected app results are provided from the app search module 508 to a scoring module 514.

The query understanding pipeline 504 may also provide one or more query parses to a rules-based search module 524. The rules-based search module 524 consults a set of rules from a rules store 528. For example, the rules store 528 may identify terms relevant to certain verticals. For example, the verbs watch, stream, and download may be actions relevant to video content. A rule from the rules store 528 may therefore attempt to find a functional URL that accomplishes the specified function using an entity from the entity data store 272. For example, if the first token of a query parse is the verb watch, and there is only one additional token in the parse, a rule may attempt to match the second token to a movie name in the entity data store 272.

The rules-based search module 524 may have additional context rules. For example, if one of the tokens in the query parse is "cheap", the rules-based search module 524 may attempt to find functional URLs for which a price can be specified. As another example, when one of the tokens in a query parse is "YELP", the rules-based search module 524 may select a functional URL corresponding to the YELP app where the remaining tokens in the query parse can supply the parameters of the functional URL. Even if the remaining tokens do not identify specific entities in the entity data store 272, the rules-based search module 524 may perform search forwarding to the dynamic acquisition module 536 so that the YELP app itself can return results for the remaining tokens.

The query understanding pipeline 504 may attempt to identify which types of entities are specified in the query. This can be used to select relevant rules. For example, if the query wrapper is determined to include an entity of type cuisine and an entity of type location, rules that require both the cuisine and location will be applicable (such as a restaurant search within a particular app). Additional information about identifying, and searching based on, entity types is provided in commonly assigned U.S. Provisional App. No. 62/220,737 filed on Sep. 18, 2015, titled "Entity-Type Search System," with first-named inventor Sudhir Mohan, the entire disclosure of which is incorporated by reference.

For rules that apply to static states, an entity-based retrieval module 532 may be provided with the query parse. The entity-based retrieval module 532 attempts to identify a corresponding entity in the entity data store 272 and to form a functional URL for provision to the scoring module 514. When the rules-based search module 524 identifies a rule corresponding to a dynamic state, a dynamic acquisition module 536 may be provided with the query parse.

In various implementations, in situations where the entity-based retrieval module 532 is not able to identify a corresponding entity in the entity data store 272, the entity-based retrieval module 532 may signal that failure to the rules-based search module 524. The rules-based search module 524 may then convert that query into a dynamic query and send the dynamic query to the dynamic acquisition module 536.

In other implementations, the rules-based search module 524 attempts to identify dynamic queries regardless of whether results are returned from the entity-based retrieval module 532. In some implementations, the entity-based retrieval module 532 may even be omitted. The rules-based search module 524 may, as described above, identify which rules or templates from the rules store 528 can be satisfied with the entity types recognized by the query understanding pipeline 504. Rules that can be instantiated by entity types matching the entities identified by the query understanding pipeline 504 are provided to the dynamic acquisition module 536.

In various implementations, multiple alternative query parses are provided to the rules-based search module 524. For example, a single text string from the query wrapper may correspond to different types of entities. As just one example, the name of a movie may be in common with the name of a corresponding book, a remake of the movie, and a video game based on the remake. This corresponds to three different types of entities. As a result, three different groups of rules may be instantiated based on these entity types.

To avoid overwhelming the dynamic acquisition module 536 with dynamic queries, the rules-based search module 524 may rely on signals from the query understanding pipeline 504 regarding which entity types are most likely. For example, the query understanding pipeline 504 may include, in a simplistic form, a dictionary of entity names along with their relative popularities. The rules-based search module 524 may only forward rules to the dynamic acquisition module 536 when they correspond to entity types having the highest likelihood from among the potential entity types. The dynamic acquisition module 536, as described in more detail below, operates one or more emulator instances 550 to dynamically execute and scrape content from an app. The dynamic acquisition module 536 then provides deep view card (DVC) content to a result generation module 560.

The scoring module 514 receives functional URLs from the app search module 508, the index search module 516, the rules-based search module 524, and the entity-based retrieval module 532. The scoring module 514 assigns scores to each result and provides the top-scoring results to the result generation module 560.

The result generation module 560 includes storage for data indicating the reliability of DV content from various apps. The result generation module 560 is therefore able to sort deep view content from the dynamic acquisition module 536 and more prominently display deep view content from reliable apps. The result generation module 560 also arbitrates between displaying deep view content and scored results from the scoring module 514. Once results are chosen from the scored results from the scoring module 514 and the deep view content from the dynamic acquisition module 536, search results are returned to the requesting device.

Figure 7B:
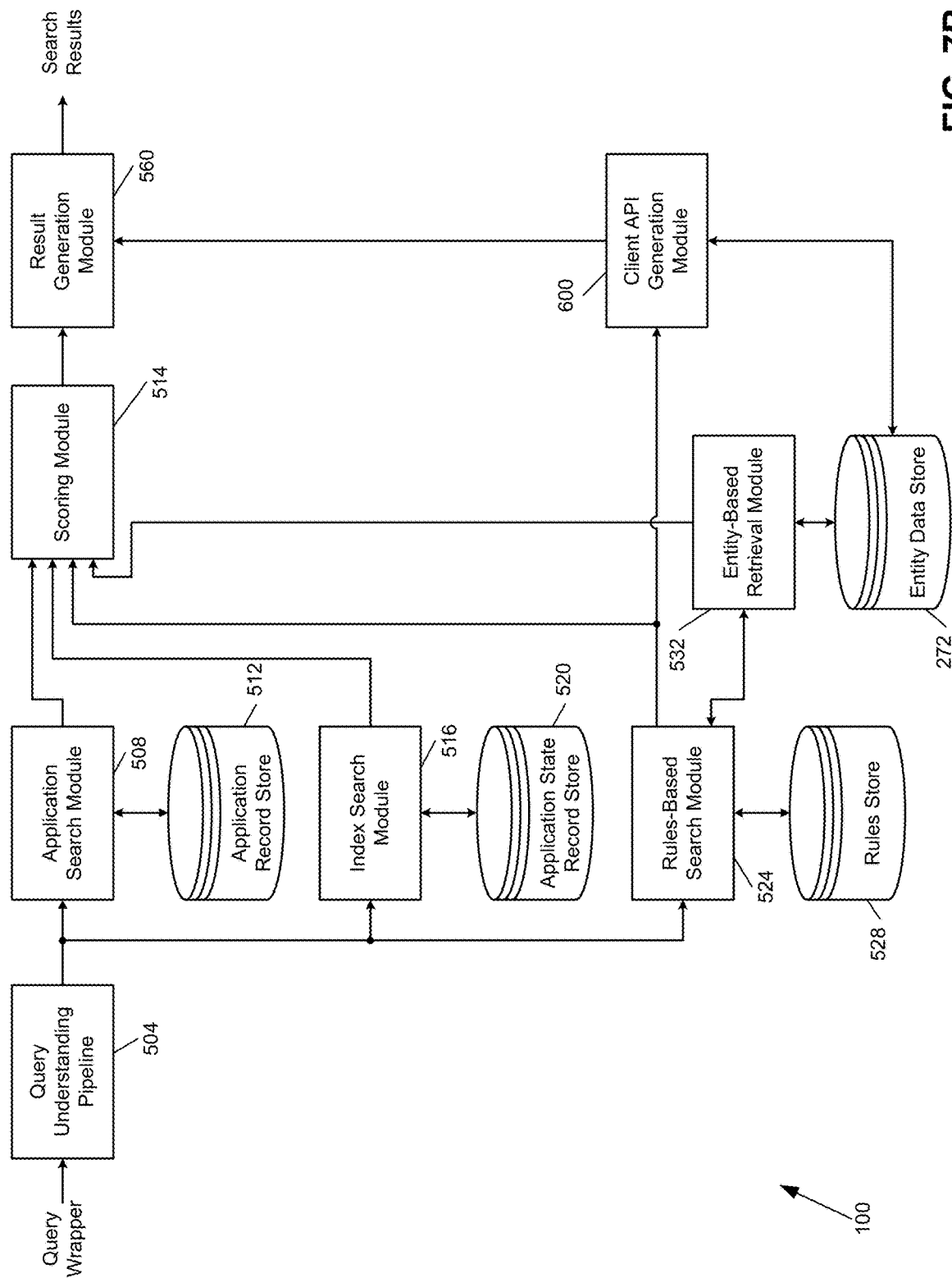

In FIG. 7B, the dynamic acquisition module 536 of FIG. 7A is replaced with a client API (application programming interface) generation module 600. The client API generation module 600 prepares instructions for a client device to make an API call to the search system and to generate DVC content based on the response to the API call.

In various implementations, the information about the API call and DVC generation may be encapsulated in a descriptive format such as JSON (JavaScript Object Notation). In other implementations, the client API generation module 600 generates code, such as JavaScript code, to make an API request and to generate DVC content based on the results. This code can be executed by the client device to make API calls and to generate DVCs.

Figure 8A:
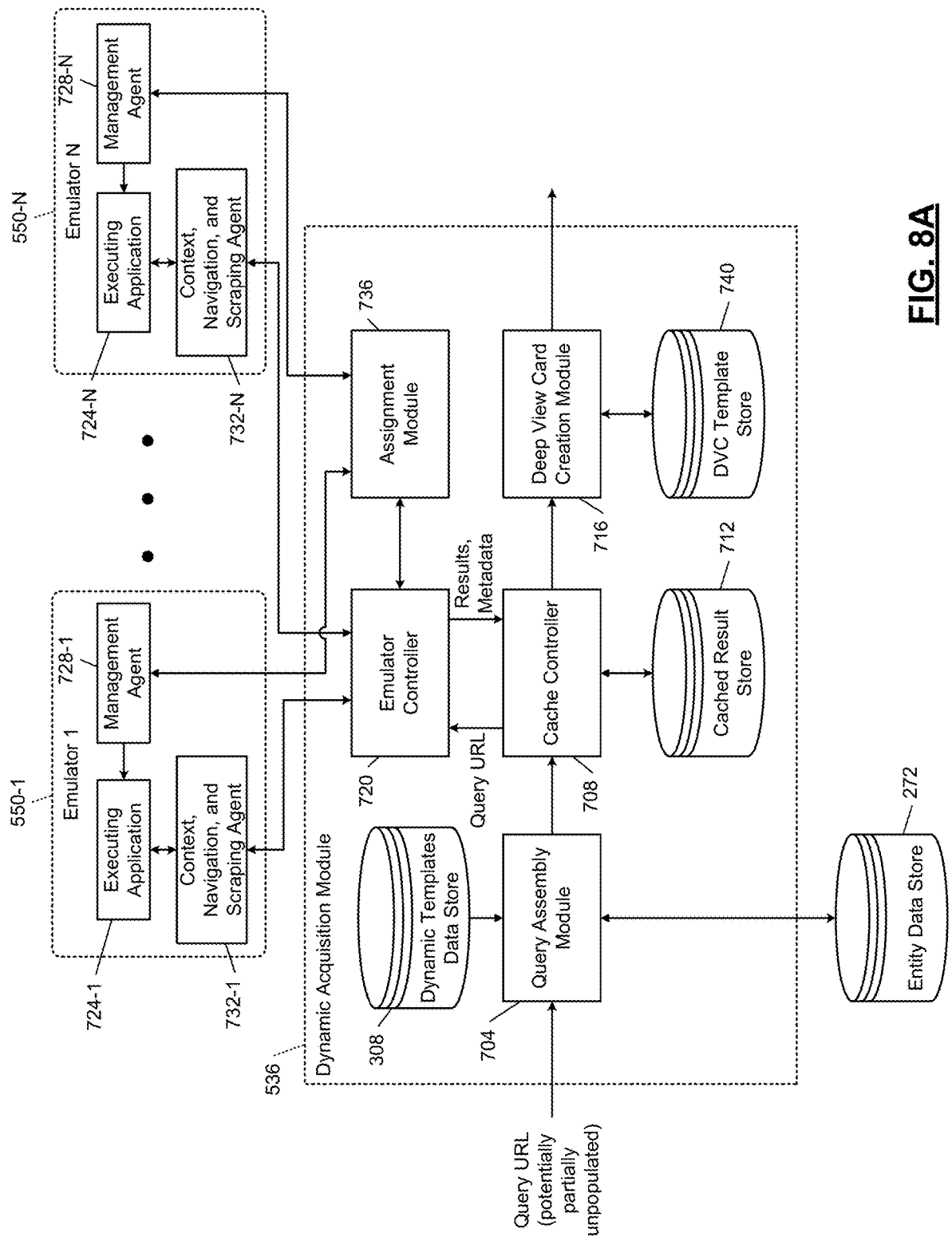
FIG. 8A is a functional block diagram of an example implementation of the dynamic acquisition module of FIG. 7A.

In FIG. 8A, an example implementation of the dynamic acquisition module 536 of FIG. 7A is shown. A query assembly module 704 receives a query URL from the rules-based search module 524. A query URL may be partially unpopulated. For example, as shown in FIG. 4, the functional URL 304-3 does not specify a location ID as the corresponding template 312-3 requires. The query assembly module 704 therefore consults the entity data store 272 to identify relevant entities to populate (or, instantiate) the template. The query assembly module 704 may also convert between analogous entity types. For example, some apps may represent location using latitude-longitude, while others use zip code, and still others use city name.

Based on the dynamic templates, and as demonstrated in FIG. 4, the query assembly module 704 instantiates the relevant template based on parameter values from the query URL as well as from the entity data store 272. The completed query URL is provided to a cache controller 708. The cache controller 708 determines whether contents related to the query URL have already been obtained. A cached result store 712 stores data previously retrieved from apps.

The cache controller 708 may apply various eviction policies, including first-in first-out, and may supplement eviction policies based on variables such as frequency of access and change rate. In other words, cached results that are accessed more frequently are less likely to be evicted from the cached result store 712. Meanwhile, search results that appear to change frequently are evicted more quickly from the cached result store 712.

If the cached result store 712 already contains the results of a prior scrape of the query URL, then the results are simply passed through to a deep view card (DVC) creation module 716. Otherwise, the cache controller 708 provides the query URL to an emulator controller 720. The emulator controller 720 controls the emulator instances 550. In FIG. 8A, there are N emulator instances 550-1 through 550-N.

Each of the emulators 550 may be operating in a cloud hosting environment or in servers owned and/or administered by the operator of the search system 100. In some implementations, the emulators 550 are operated on general purpose computing instances using emulator software provided by the search system 100. In other implementations, the emulators 550 are pre-configured emulator instances provided by a cloud emulation hosting provider.

In emulator 550-1, the host operating system (such as the ANDROID operating system or the APPLE IOS operating system) is running. In some implementations, some operating systems may not have suitable emulators, in which case physical devices may run the operating systems and serve as the emulators 550. For example only, a bank of physical smartphones may all be electrically connected (such as via USB) to an interface card that is controlled by the emulator controller 720.

Physical devices may be provided via a cloud platform so that the physical devices can be provisioned as needed. The cloud provider will have a physical limit to the availability of devices according to the number of physical devices that the cloud provider physically possesses. The physical devices may be loaded with a modified copy of a standard operating system, which may have been modified with additional accessibility, control, or user interface scripting features.

In some implementations, simulators may be used. A simulator may be considered a species in the emulator genus. Therefore, when the term emulator is used in this disclosure, both full hardware emulators as well as software simulators are encompassed by the term. Similarly, the term "device" may be a superset of emulator, and include both physical hardware devices as well as emulators.

While a full hardware emulator emulates device hardware and allows an exact or lightly-modified copy of an operating system to execute on the emulated hardware, a simulator offers a subset of the features of the full hardware emulator. For example, the simulator may simulate responses to API (Application Programming Interface) calls that a typical app would expect to invoke while executing.

In a simulation, the full native operating system running on real or emulated hardware is replaced by a set of libraries that, for most apps, are ideally indistinguishable, as far as an app is aware, from executing on an actual device running that operating system. Limitations of simulators may include a lack of sensor inputs (such as accelerometers), an inability to place or receive telephone calls, and the absence of accurate GPS (Global Positioning System) data.

Because simulators do not attempt to emulate specific hardware, they often require fewer processing and memory resources from the host operating system. This allows many more simulators to be run on a server than emulators. For example only, compared to hardware emulators, ten times more simulators may be simultaneously hosted. As described in more detail below, each simulator may be used for a different app, although multiple simulators may host copies of the same app for apps that are more popular, more rapidly changing, or that require more time to acquire results.

For example, apps written for the iOS operating system from Apple, Inc. may be loaded into simulators executing on the OS X operating system from Apple, Inc. One instance of the OS X operating system may be configured to host multiple simulators. In one example, eight simulators are hosted. In fact, a server (such as a server running a variant of the LINUX operating system) may include multiple virtual machines, each operating a virtualized instance of the OS X operating system, each OS X operating system hosting multiple simulators.

Similar to iOS platform simulation on OS X, some ANDROID operating system apps may be executed using a runtime, such as Android Runtime for Chrome (ARC; alternatively, App Runtime for Chrome). An app may be referred to as an APK, the filename extension for a packaged version of an app. The APK may be repackaged or recompiled to work in a simulated environment. In some cases, this may be done programmatically without manual intervention of a software program.

The ARC may be integrated with the CHROME operating system and allows an app to run in a sandbox (a restricted memory area segregated from the rest of the operating system). In other implementations, the ARC may be implemented as an extension to the CHROME browser. For example, an implementation of the ARC framework named ARChon may allow an Android app to execute within a sandbox in a Chrome browser on operating systems other than Chrome OS, such as the Windows operating system, the Linux operating system, and the OS X operating system.

In the emulator 550-1, one or more executing apps including an executing app 724-1 are operating in the emulated operating system. A management agent 728-1 determines which apps are installed in the emulator 550-1 as well as which apps are currently executing. A context, navigation, and scraping agent 732-1 indicates to the management agent 728-1 that an app needs to be downloaded, installed, and/or executed to service a command from the emulator controller 720.

Generally, the emulator controller 720 will send commands to an emulator already possessing, and ideally already executing, the desired app. An assignment module 736 of the dynamic acquisition module 536 tracks which apps are executing on which of the emulators 550. Based on load, the assignment module 736 may allocate more or fewer of the emulators 550 for certain apps. The emulator controller 720 may consult the assignment module 736 to determine which of the emulators 550 a scraping command should be sent to.

Returning to the emulator 550-1, the agent 732-1 provides context to the executing app 724-1, such as by forcing location services of the operating system to indicate that the emulator 550-1 is actually operating at the same location as the user device having sent the search query. The agent 732-1 may also set a time of the emulator 550 to match a time zone of the requesting user device.

The agent 732-1 focuses the executing app 724-1 and navigates to a desired state according to a predetermined breadcrumb trail. In various implementations, opening and navigating may be performed with a single API (Application Programming Interface) call, which may be referred to in some circumstances as an intent. The navigation agent may also inject user interface events to the executing app 724-1 to navigate from one state to another.

Once a desired state is reached, such as a search results state for a commanded search, the agent 732-1 scrapes text, images, and metadata from the state of the executing app 724-1. In various implementations, the agent 732-1 may also extract other types of media, such as audio, or video. The scraped content is returned to the emulator controller 720, which provides the results and the metadata to the cache controller 708.

The cache controller 708 forwards the data to the DVC creation module 716 and optionally stores the retrieved data into the cached result store 712. The DVC creation module 716 consults a DVC template store 740 to determine which data from the search results to incorporate into DVCs. In addition, the DVC template store 740 may include the layout and formatting of the data for creating DVCs. The DVC creation module 716 outputs completed DVCs to the result generation module 560, such as in FIG. 7A.

Figure 8B:
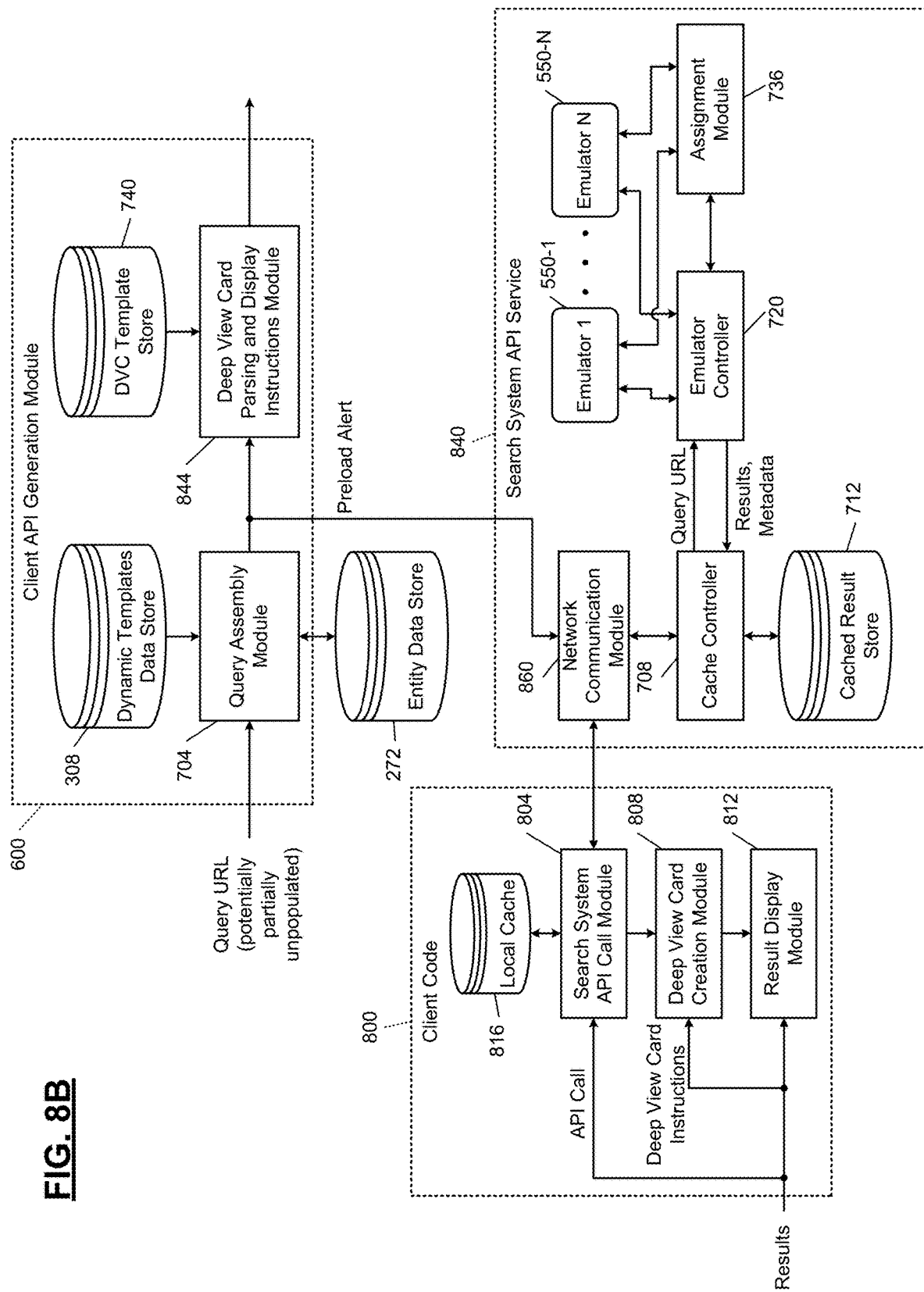
FIG. 8B is a functional block diagram of an example implementation of an arrangement for search system API call creation and client API invocation.

In FIG. 8B, an alternative implementation corresponding to the client API generation module 600 of FIG. 7B is shown. For various reasons, such as latency, it may be desirable for the client to make a request for DVC content to be scraped and returned directed to the client than for that content to be acquired at the search system and then provided to the client. Also, the client may be able to provide additional, or more accurate, context within an API call, such as exact location, sensor data, screen resolution, installed apps, and active registered accounts.

Therefore, the client API generation module 600 may provide a pre-formatted API call as well as instructions for DVC generation to the client. Client code 800, which may have been received in a software development kit (SDK) provided by the search system 100, or may be included in a standalone search app, receives results from the search system 100. Some of the results may have been generated by the client API generation module 600 and therefore have one or more API calls, which are provided to a search system API call module 804, and deep view card (DVC) instructions, which are provided to a DVC creation module 808. All of the other results are provided directly to a result display module 812.

The search system API call module 804 selectively sends an API call to a search system API service 840, which responds with DVC content. In various implementations, a local cache 816 may store DVC content, which would eliminate the need to make an API call for content that is cached. Further, the search system API call module 804 may wait to send an API call until it appears that the user will actually view the resulting DVC content. As one example, API calls for results that would not appear in the first screen of results may not be sent immediately. In addition, the search system API call module 804 may recognize that some API calls may not be relevant to a user of the device, such as if the API call relates to an app the user has indicated a dislike for.

The client API generation module 600 includes the query assembly module 704, which may be similar to that shown in FIG. 8A. A DVC parsing and display instructions module 844 consults the DVC template store 740 to determine how to parse returned content and generate DVCs for the query generated by the query assembly module 704. These instructions are provided as results transmitted to the client code 800 via the result generation module 560.

To mitigate delay between the query URL generation and the later API call by the client code 800, a preload alert may be generated in response to the query URL and provided to a network communication module 860 of the search system API service 840. The assignment module 736 may ensure that at least one app related to the expected API request is installed on one of the emulators 550. In addition, the emulator controller 720 may begin to speculatively navigate to the desired state of the app so that the expected API call can be serviced promptly.

The network communication module 860 receives the API call from the search system API call module 804 of the client code 800 and provides the query URL to the cache controller 708, which may be similar to the cache controller 708 of FIG. 8A. When the cache controller 708 returns results, either from the cached result store 712 or from the emulator controller 720, the network communication module 860 provides the content to the search system API call module 804. The search system API call module 804 provides the content to the DVC creation module 808.

Based on DVC instructions related to parsing and display, the DVC creation module 808 generates, formats, and scales (according to the screen size and resolution of the device) DVCs. These DVCs are provided to the result display module 812, which combines the DVCs from the DVC creation module 808 with any other results provided by the search system 100.

Figure 9:
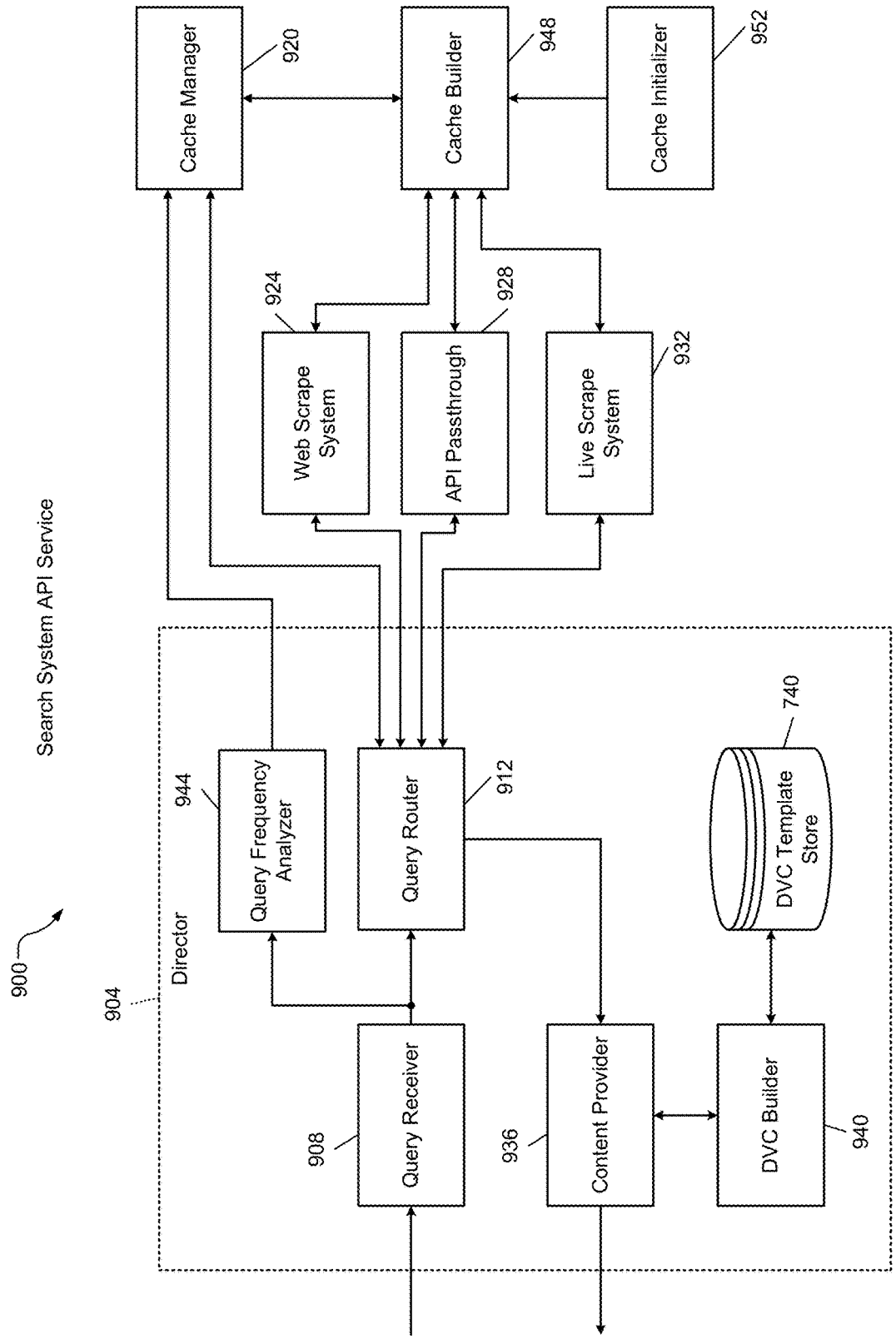
FIG. 9 is a functional block diagram of an example search system service.

In FIG. 9, another example implementation of a search system API service 900 is shown. The search system API service 900 includes a director 904 with a query receiver 908 that receives queries. For example, queries may be received over a network connection from a user device, such as a user device programmed with the client code 800 of FIG. 8B.

A query router 912 of the director 904 determines whether the query can be satisfied from cached results by consulting the cache manager 920. If the query cannot be satisfied by cached results, if caching is not enabled in the search system API service 900, or if the cached results are out of date, the query router 912 forwards the query to one or more of a web scrape system 924, an API passthrough 928, and a live scrape system 932.

Results that are substantially out of date may have already been deleted by the cache manager 920. Meanwhile, cache results that are only slightly out of date may be verified by passing the query to the web scrape system 924, the API passthrough 928, and/or the live scrape system 932. Results that are being verified may immediately be returned for presentation to a user. Results that have changed or been deleted can be updated in a further message to the user device. This increases responsiveness and may not even be discernible to a user of the user device. Results that are frequently found to have changed during verification indicate that the app updates more frequently than the cache is updated. The data should therefore be evicted from the cache or marked as stale more quickly.

Results from one of these sources or from a combination of the sources are provided from the query router 912 to a content provider 936. The content provider 936 provides results of the query back to a client. For example only, results of the query may be in the form of one or more DVCs. A DVC builder 940 may construct DVCs from data obtained by the content provider 936. The DVC template store 740 may determine what data is relevant for the DVC and may specify how to format the DVC.

In various implementations, the content provider 936 receives some results already in a DVC format and receives some results with raw data not already formatted as a DVC. Results that are already in the form of DVCs may in some implementations still be provided to the DVC builder 940, which may apply a different template, as specified by the DVC template store 740. Different DVC templates may be used for different types of user devices. For example, a different size or style of DVC templates may be specified for a tablet as compared to a phone.

A query frequency analyzer 944 analyzes incoming queries from the query receiver 908 and identifies queries that are received frequently enough that those queries should be cached. A determination of whether to cache the results of the query is indicated to the cache manager 920. In some implementations, all results are cached until the cache manager 920 runs out of storage space allocated for query result storage. In such implementations, the query frequency analyzer 944 may help the cache manager 920 determine which results to evict first from storage in order to make room for new results.

Without a query frequency analysis, the cache manager 920 may simply evict the oldest results in a first in, first out scheme. The query frequency analyzer 944 may have a higher threshold that determines when a query is popular enough that the results for that query should be pre-fetched in anticipation of further receipt of such a query. These queries may be rerun on a periodic basis so that results are fresh. Further, these queries of interest may be precluded from eviction from cache storage.

The cache manager 920 may determine how frequently the results change for these queries of interest and adjust the periodic retrieval rate accordingly. In addition, some queries remain static during certain conditions, such as certain times of the day or days of the week. For example, live public transit data may not change from a time when the last train stops running at midnight until the next train begins at 5:00 a.m.

The cache manager 920 may therefore define conditions during which certain queries are not rerun, thereby decreasing the resources of both the search system API service 900 and the source of the data. The cache manager 920 provides queries of interest to a cache builder 948. The cache builder 948 then requests results from one or more of the web scrape system 924, the API passthrough 928, and the live scrape system 932. The cache builder 948 may have access to the same routing information as the query router 912, or may use the query router 912 to select an appropriate system for a query.

A cache initializer 952 may have a set of pre-stored queries that are provided to the cache builder 948 prior to the query frequency analyzer 944 identifying queries of interest. The cache initializer 952 may be populated by an operator of the search system API service 900, who may have empirical data and educated guesses about which queries will prove popular.

The web scrape system 924 may implement a traditional web scraping algorithm or may be glue logic for interfacing with a traditional web scraper. In various implementations, a functional URL received from the query router may be transformed into a web URL, and the web scrape system 924 then accesses the web URL using HTTP (hypertext transfer protocol). Content, such as an HTML (hypertext markup language) is returned by the web server identified by the web URL and scraped.

The API passthrough 928 passes an API call through to a third-party app that publicly exposes an API. The API passthrough 928 may include or access a data store with records indicating how to transform a functional URL into an API call recognized by the third-party API. In various implementations, the third-party API may not be documented but is publicly accessible. If the undocumented third-party API ceases to work as expected or is blocked, the query router 912 may direct requests for that API instead to the app itself in the live scrape system 932.

Figure 10:
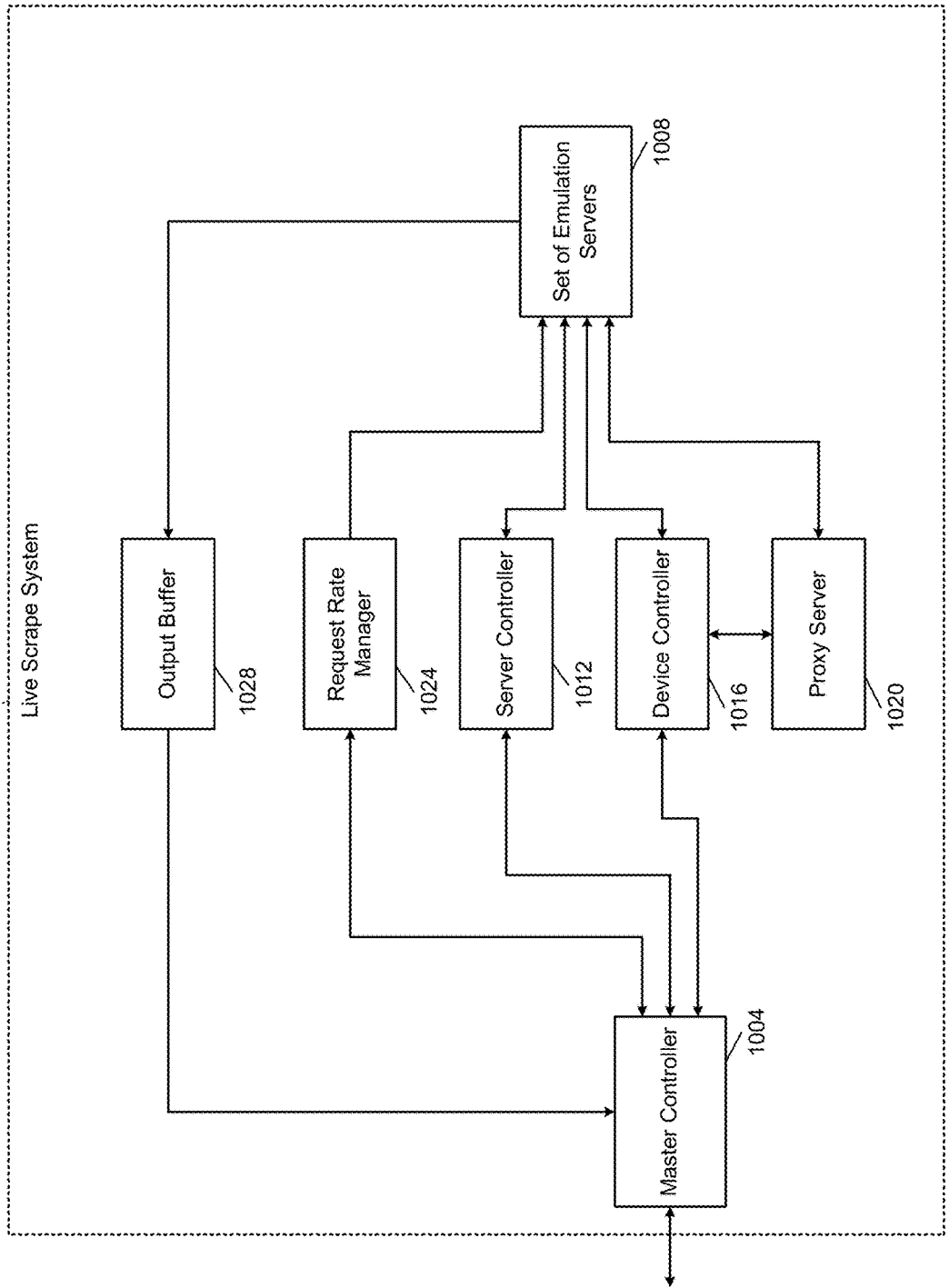
FIG. 10 is a functional block diagram of an example implementation of the live scrape system of FIG. 9.

In FIG. 10, an example implementation of the live scrape system 932 is presented. A master controller 1004 receives queries, such as from the query router 912 or the cache builder 948 of FIG. 9. The master controller 1004 controls a set of emulation servers 1008 via a server controller 1012. As described in FIG. 11, each server of the set of emulation servers 1008 includes multiple emulator instances.

The server controller 1012 initializes each server of the set of emulation servers 1008, starts and stops (including, in various implementations, powering up and powering down) each server of the set of emulation servers 1008, and manages the health of each of the emulation servers 1008. Servers may be started and stopped depending on load of the live scrape system 932.

In a virtualized hosting environment, the server controller 1012 may start additional server instances, thereby growing or shrinking the size of the set of emulation servers 1008, according to demand, either current or expected. The server controller 1012 may recognize patterns over time, such as whether days of the work week have a higher demand than do days of the weekend. In addition, the server controller 1012 may recognize the pattern that a higher demand is present in the evenings than compared to the morning or afternoon.

The server controller 1012 may monitor a load on the live scrape system 932, which may be measured as a percentage of total capacity, and may start or power on servers from the set of emulation servers 1008 when the utilization rises above a first threshold. In some implementations, a second, lower threshold may be used by the server controller 1012 to determine when to power down, idle, or stop servers in the set of emulation servers 1008. This hysteresis prevents brief lulls in activity from causing servers to be stopped that then quickly need to be restarted. Hysteresis may also be created by waiting for a predetermined amount of time with utilization below the second threshold before stopping servers. To prevent instantaneous spikes in activity from causing more servers to be started, a time delay may be applied to the first threshold as well. In other implementations, a moving average may smooth brief peaks and troughs in utilization.

A device controller 1016 interfaces with the devices on each of the set of emulation servers 1008. The device controller 1016 initializes the device with an operating system and optionally one or more default apps. Although the present disclosure will be described in terms of emulators, the principles of the present disclosure also apply to instances where simulators or physical devices are used instead of or in addition to emulators.

The device controller 1016 maintains an open session between each of the emulators in the set of emulation servers 1008 and the master controller 1004. The device controller 1016 also establishes which apps will be installed on which emulators and which app is in the foreground. In addition, the device controller 1016 may determine which apps are running on any each emulator.

When simulators are used, the device controller 1016 may only be able to assign a single app to the simulator. In various implementations, the server controller 1012 may start some servers that host hardware emulations and some servers that host simulations. In implementations where the operating system of the server cannot directly host an emulator instance, the server may instead have virtualized environments that support an operating system that can host the emulator. As one example, which may conjure images of a stack of turtles, a cloud provider such as Amazon Web Services (AWS) may provide virtualized servers.

For example only, AWS hosts a virtual server running a variant of the Linux operating system. This virtual server may run a hypervisor or other controller for a virtual machine that runs the OS X operating system. The virtualized OS X operating system provides a simulator that simulates the APIs of an iOS operating system device for the benefit of an app running in the simulator. Subject to licensing restrictions, each virtualized server provided by AWS can theoretically host multiple instances of a virtualized OS X operating system, and each of the virtualized OS X operating system instances can execute multiple simulators, each simulator hosting one app.

In fact, some simulators may allow for multiple apps to be simulated, which may be helpful for developers to simulate interactions between apps. The server controller 1012 or the device controller 1016 may control which app or apps each simulator hosts and may stop or modify a simulator to replace the app being hosted.

The device controller 1016 may also assign network addresses to each emulator using a proxy server 1020. For example, the device controller 1016 may select from a pool of available IP addresses. In some implementations, this pool of available IP addresses may be associated with different geolocation values. As a result, when the emulator contacts a service that infers geolocation from IP address, the emulator can appear to be located in that geographic region. In other implementations, the device controller 1016 may simply assign IP addresses to the emulators in a round-robin manner. The proxy server 1020 interfaces between each of the emulators and the Internet.

A request rate manager 1024 receives each request from the master controller 1004 and applies a rate limit per app. For example, a given app may accept no more than a predetermined number of requests per hour or per day. Once this limit is exceeded, the request rate manager 1024 may indicate that further requests for data from that app cannot be satisfied. If the request does not exceed the threshold, the request rate manager 1024 provides the request to a specified one of the set of emulation servers 1008.

The master controller 1004 queues requests received from the query router 912 and the cache builder 948 of FIG. 9. The master controller 1004 may give priority to requests from the query router 912, while results from the cache builder 948 receive a lower priority, as they may be simply updating previous results in anticipation of future queries. The master controller 1004 may instruct the server controller 1012 regarding how many servers to start up as part of the set of emulation servers 1008. The master controller 1004 may instruct the device controller 1016 which apps to install and execute on each emulator in the set of emulation servers 1008.

Figure 11A:
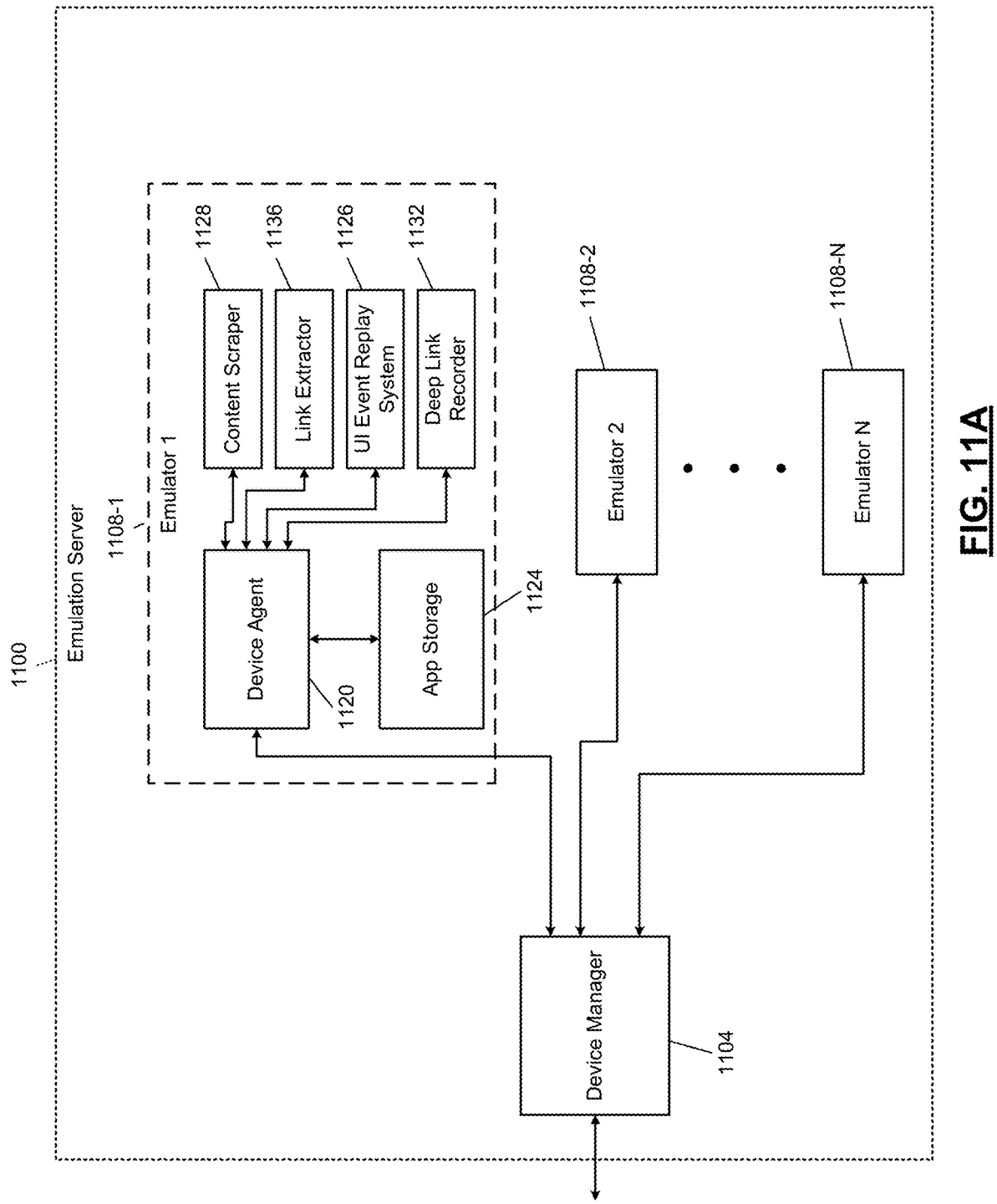
FIG. 11A is a functional block diagram of an example implementation of an emulation server of FIG. 10.

In FIG. 11A, an example implementation of an emulation server 1100 (such as one of the set of emulation servers 1008) includes a device manager 1104 that interfaces between emulators 1108-1, 1108-2, . . . 1108-N (collectively, emulators 1108) and the request rate manager 1024 of FIG. 10.

Requests from the request rate manager 1024 are provided to a specified one of the emulators 1108. Results are returned to an output buffer 1028 of the live scrape system 932 via the device manager 1104. In response to the device controller 1016 of FIG. 10, the device manager 1104 provides instructions to the emulators 1108 regarding which apps to install and to run.

In the emulator 1108-1, a device agent 1120 communicates with the device manager 1104. The device agent 1120 may be an installed app but with greater privileges than a regular app. For example, the device agent 1120 may be installed as a launcher app in the emulator 1108-1. In other implementations, the device agent 1120 may be incorporated into an operating system, such as the ANDROID operating system, used in the emulator 1108-1.

App storage 1124 allows for storage of apps that may be executed in order to return results for a query. The apps stored in app storage 1124 may be pre-loaded when the emulator 1108-1 is instantiated or may be added by request of the device manager 1104. The app storage 1124 may be standard storage for apps provided by the operating system or may be a separate repository.

The device agent 1120 uses a user interface (UI) event replay system 1126 to navigate to a specific state of an app from which information is to be extracted. A content scraper 1128 extracts content from the specific state. For example, the content may include text, images, and metadata (which may include explicit metadata, such as image tags, or may be inferred from location or formatting of text or images).

The content scraper 1128 may extract a UI tree of elements from the state and encode that tree using XML (Extensible Markup Language). The content scraper 1128 may also capture screenshots of a state. In some implementations, instead of taking a screenshot of an entire display, individual screenshots may be taken, with each screenshot corresponding to a search result. Each of these screenshots may correspond to or be transformed into deep views (DVs).

In some implementations, additional data about a result is desired for creating a DV. In such situations, the search result is not simply scraped but is also followed. When traversing to a new state from a search result, the resulting state may provide additional information. For example only, in a restaurant review app, traversing a search result for a restaurant may lead to additional details about the restaurant, such as hours of operation. A combination of screenshots and textual data (including structured data, such as XML) can be provided as a result of a requested query.

The device agent 1120 controls which apps are executing, which apps are installed, and which app is in the foreground. In various implementations, bringing an app to the foreground or installing an app may be performed using the UI event replay system 1126. In other implementations, installing an app may be performed by providing an install instruction to a built-in app retrieval mechanism such as the GOOGLE PLAY digital distribution platform from Google, Inc. or the APP STORE digital distribution platform from Apple Inc.

The device agent 1120 may also be able to fire (that is, call) methods (also referred to as intents) that direct an app to transition to a particular state. When available, firing a method can be performed instead of navigating using simulated UI events from the UI event replay system 1126. In other situations, such as where a method is not available to directly arrive at a certain state, a method may be fired to perform some of the navigation, followed by the UI event replay system 1126 completing the navigation.

The deep link recorder 1132 may be included to record paths to certain states for later replay to reach those states once again. A link extractor 1136 may be used to identify other states of interest that should be crawled either by a crawling system or within the emulator 1108-1. The emulator 1108-2 and the remaining emulators 1108 may operate similarly to the emulator 1108-1.

Figure 11B:
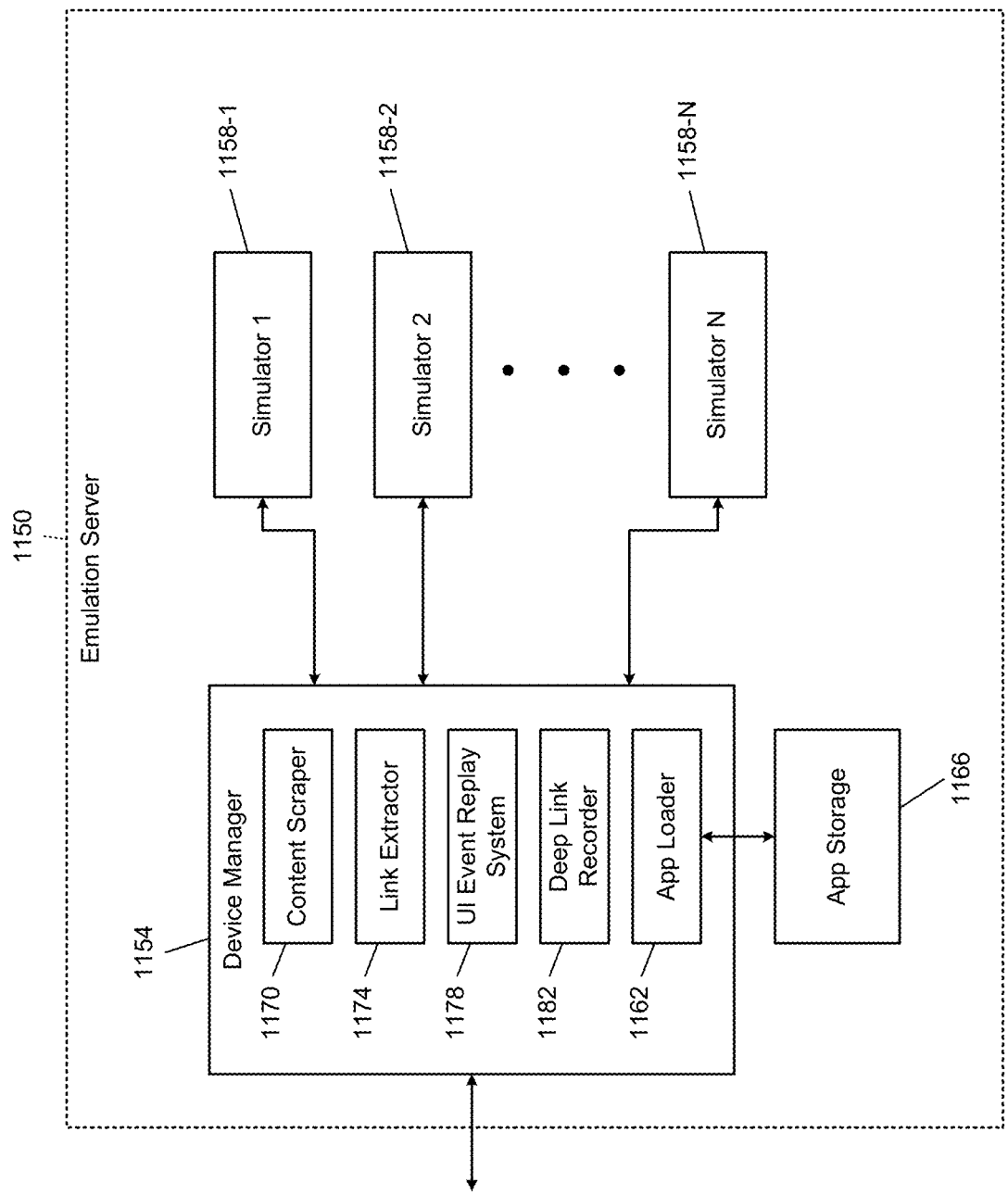
FIG. 11B is a functional block diagram of another example implementation of an emulation server.

In FIG. 11B, an emulation server 1150 may serve as one of the set of emulation servers 1008. The emulation server 1150 includes a device manager 1154 that controls simulators 1158-1, 1158-2, . . . 1158-N (collectively, simulators 1158). The device manager 1154 may receive a request from the request rate manager 1024 of FIG. 10 and provide results to the output buffer 1028 of FIG. 10. The simulators 1158 may be included as part of an operating system of the emulation server 1150. In some implementations, the simulators 1158 may be modified, such as with a software package called Statebit. The simulators 1158, as special cases of emulators, may only simulate some of the functionality of a user device and they only allow for a single app to be simulated at a time.

The device manager 1154 includes an app loader 1162 that controls which of the simulators 1158 are responsible for hosting which apps. Packages containing the apps may be stored in app storage 1166. The device manager 1154 may include a content scraper 1170, a link extractor 1174, a UI event replay system 1178, and a deep link recorder 1182, which may be similar to items having the same name in FIG. 11A. The UI event replay system 1178 may use an accessibility framework or a scripting framework of an operating system executing on the emulation server 1150. Similarly, the content scraper 1170 may extract data from one of the simulators 1158 using screenshot and UI enumeration capability built into the operating system for accessibility, scripting, and development purposes.

Figure 12:
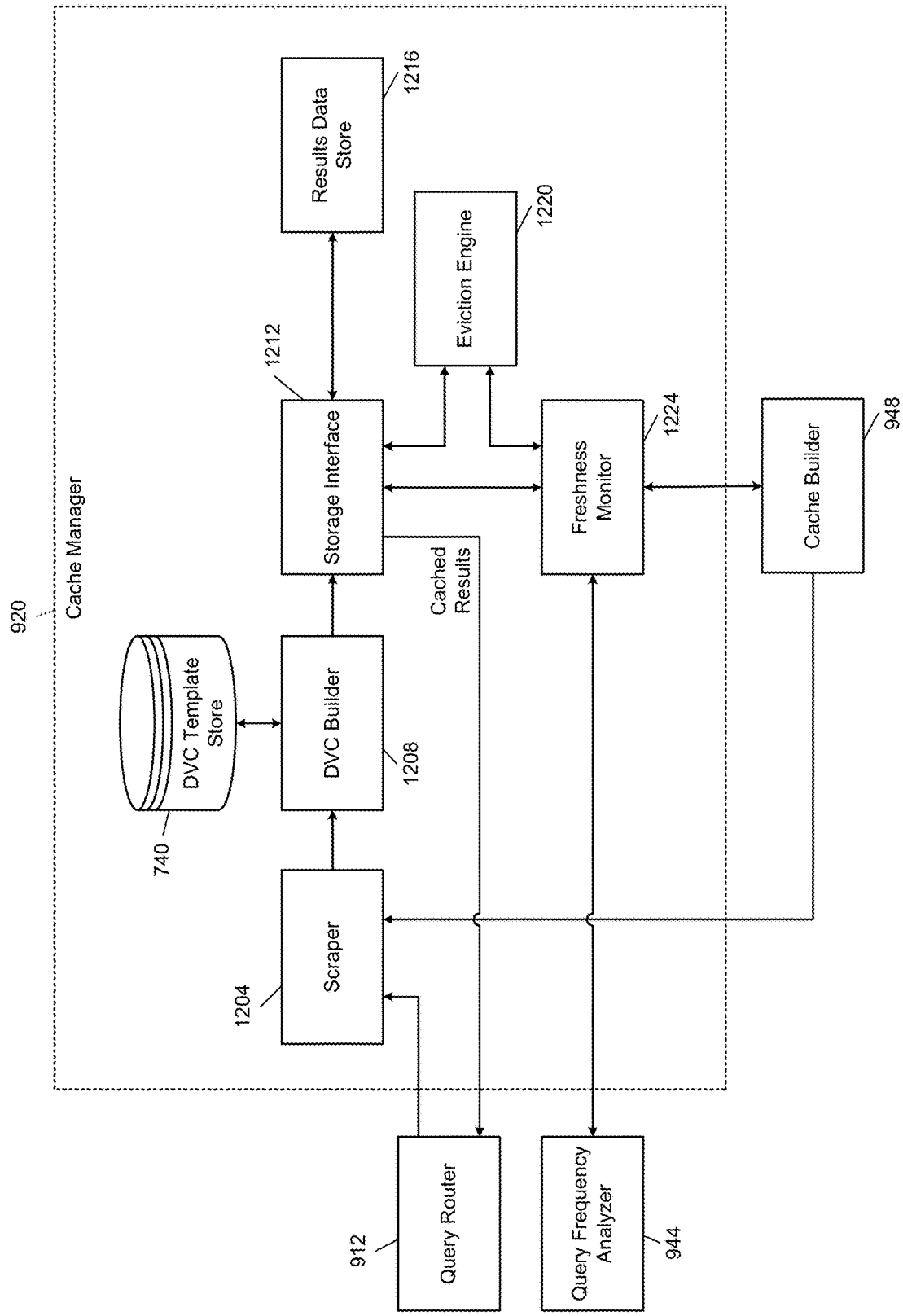
FIG. 12 is a functional block diagram of an example implementation of the cache manager of FIG. 9.

In FIG. 12, an example implementation of the cache manager 920 of FIG. 9 is shown. Retrieved data from a query is provided to a scraper 1204. The scraper 1204 takes raw data captured from a state, such as screenshot images, and extracts data of interest. For example, the scraper 1204 may assign tags to various pieces of data, may map a UI tree from the data, etc.

The raw data may include, for example, a list of all UI elements and corresponding resource IDs, and any corresponding text and images, including metadata related to formatting, such as placement and resolution of the images and font formatting of the text. The scraper 1204 may not be necessary when scraping, such as within an emulator, has already transformed raw data into scraped data.

In some implementations, a DVC builder 1208 adapts the retrieved data into a DVC format. The DVC builder 1208 may not be necessary if DVC content is directly received. Otherwise, the adaptation performed by the DVC builder 1208 may be dictated by a template from the DVC template store 740. In various implementations, the DVC template store 740 may instead be a template store specific to the cache manager 920. For example, DVCs stored within the cache manager 920 may adopt a generic format while DVCs provided to a device may have a format that is more specific to that device. In various implementations, the DVC templates used in the cache manager include a superset of all data used in corresponding device-specific templates. In other words, all potentially relevant data is cached, and some or all of it is retrieved depending on the DVC format in which the data will be output.

A storage interface 1212 maintains an index of what results are stored in a results data store 1216. The storage interface 1212 identifies whether results for the query are stored in the results data store 1216 and indicates that fact to a requester. The storage interface 1212 may include lookup tables, hash tables, etc.

In addition, the storage interface 1212 may indicate how fresh the data is. An eviction engine 1220 determines which data to remove from the results data store 1216 to allow for storage of more recent or more popular data. Further, the eviction engine 1220 may remove stale data to reduce the storage burden, which in a cloud-based environment may be charged by storage size.

A freshness monitor 1224 communicates with the query frequency analyzer 944 and determines how frequently to update the results for queries of interest. When a query of interest has reached the time at which the results should be updated, the freshness monitor 1224 sends the query to the cache builder 948.

The freshness monitor 1224 may indicate to the eviction engine 1220 which query results are of interest and should therefore not be removed as readily. In addition, the freshness monitor 1224 may recognize how frequently data is updated. If query results change each time a query is run, the freshness monitor 1224 may run a query more and more frequently until the data does not change between every pair of requests. In this way, the freshness monitor 1224 may identify an expected validity lifetime for query results.

When the freshness monitor 1224 recognizes that query results have been present longer than this expected validity time, the freshness monitor 1224 may provide that query to the cache builder 948 to refresh the data. If the validity time is too short, the freshness monitor 1224 may recognize that attempting to cache the data is impractical and therefore instruct the eviction engine 1220 to delete the corresponding results and instruct the storage interface 1212 to always respond that those results are not cached. Further, the scraper 1204 is instructed not to further process those results. For results that do not have individual freshness information, the eviction engine 1220 may remove the results stored in the results data store 1216 for the longest period of time to make way for new results.

Figure 13:
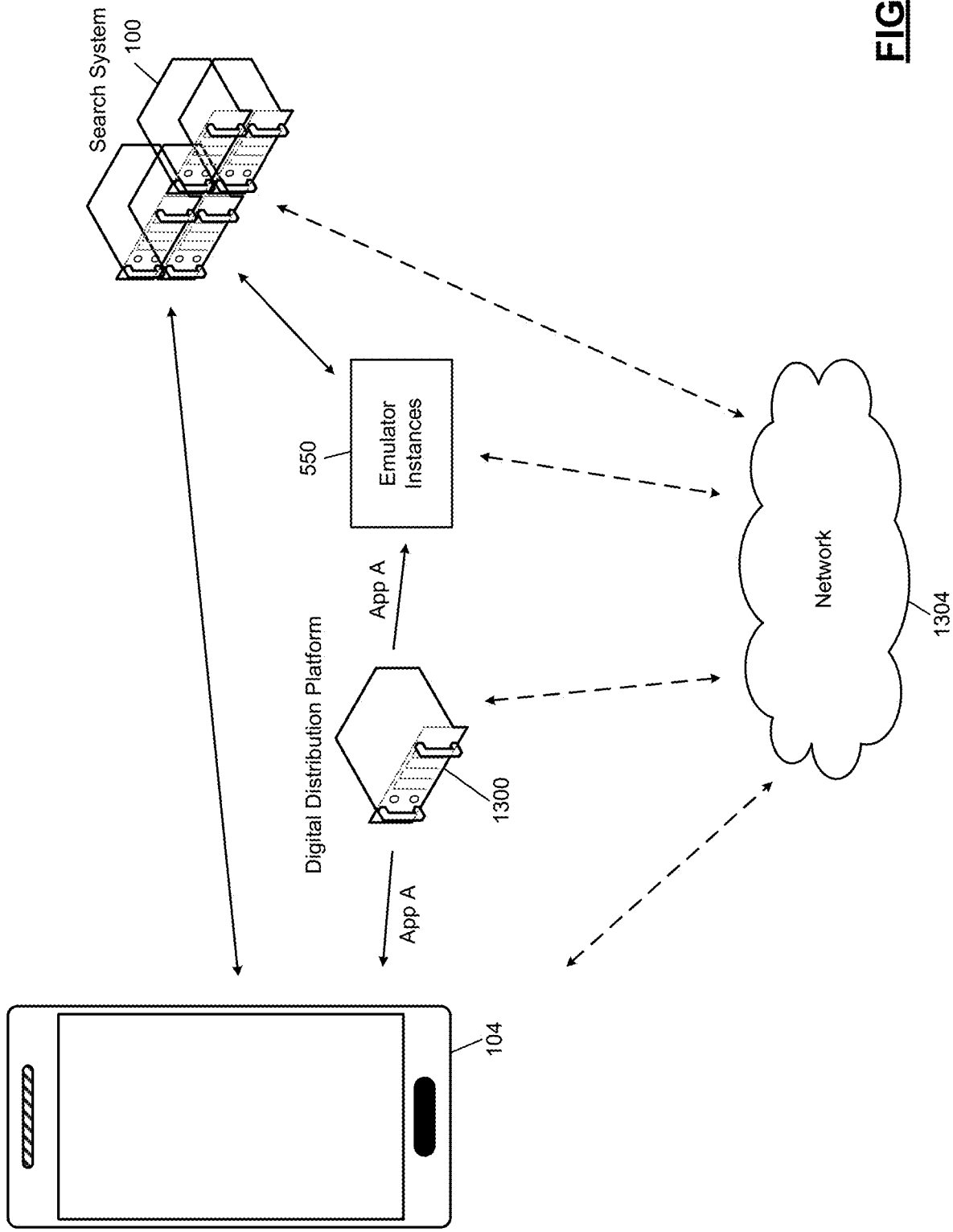
FIG. 13 is a high-level functional block diagram of communication within an example environment where the search system operates.

In FIG. 13, the device 104 is shown communicating with the search system 100, which in turn communicates with the emulator instances 550. The emulator instances 550 may receive an app ("App A" in this example) from a digital distribution platform 1300. The digital distribution platform 1300 provides apps, and may be specific to an operating system or may provide apps for multiple operating systems. For example only, the digital distribution platform 1300 may include the GOOGLE PLAY digital distribution platform, the APPLE APP STORE digital distribution platform, and the WINDOWS PHONE digital distribution platform.

Based on search results related to App A provided by the search system 100, the device 104 may wish to acquire "App A" from the digital distribution platform 1300 in order to interact further with "App A." The digital distribution platform 1300 can then supply "App A" to the device 104. Although the solid arrows in this app indicate functional data exchange, some or all communication may be by way of network 1304. The network 1304 may include local area networks, personal area networks, and wide area networks, such as the Internet.

Flowchart

Figure 14:
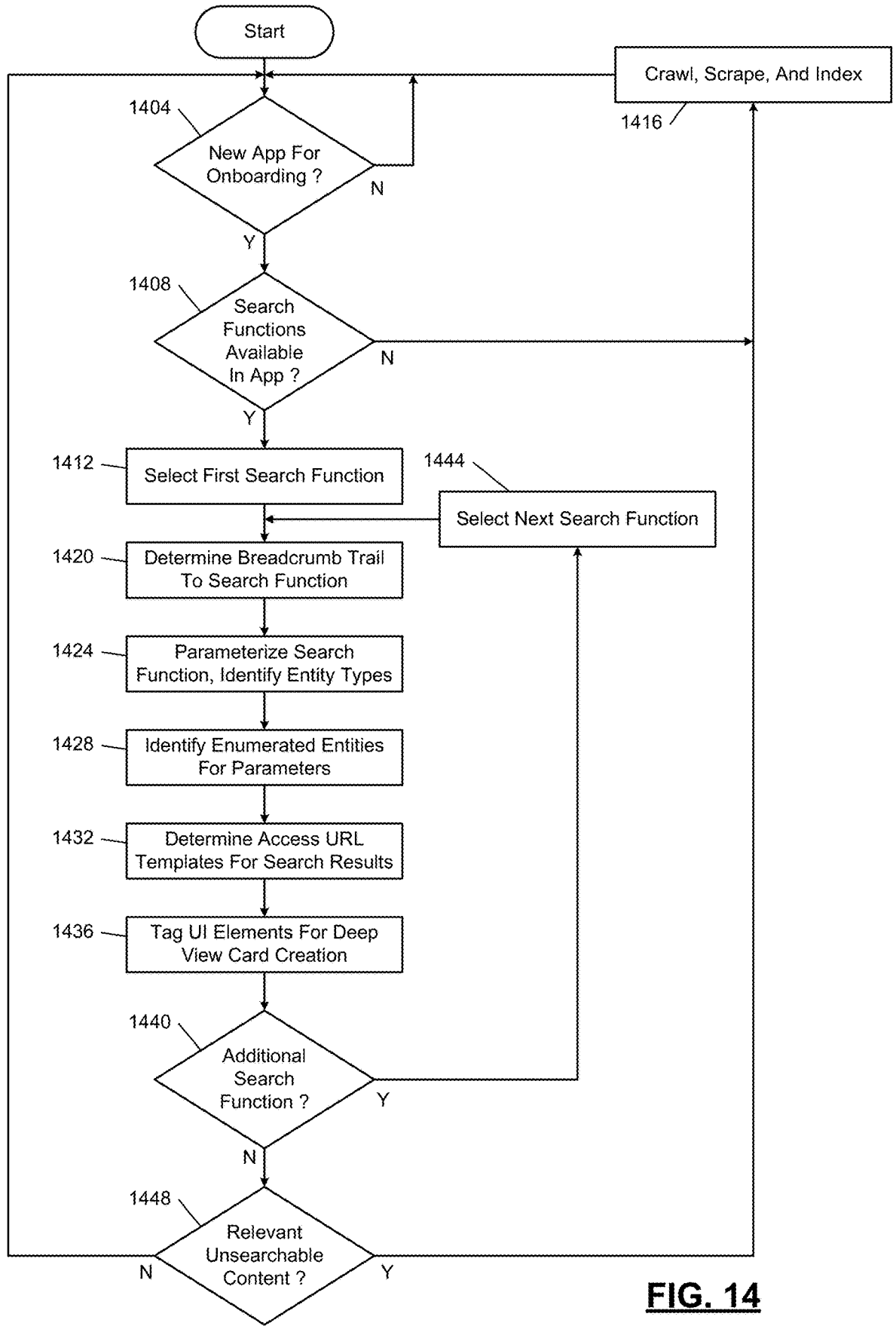
FIG. 14 is a flowchart showing example operation of integrating new apps into the search system.

In FIG. 14, a flowchart depicts example operation of an intake process for apps into the search system 100. Control begins at 1404, where if a new app is available for the intake process (referred to as onboarding), control transfers to 1408. Otherwise, control remains at 1404.

At 1408, control determines whether a search function is available in the app. If so, control transfers to 1412; otherwise, control transfers to 1416. Examples of search functions are searching for certain types of establishment within a certain geographical area, searching for reviews of a particular movie, and searching for trivia about a certain event. At 1416, the app is crawled, scraped, and indexed as usual, creating app state records, because search functions are not available to access that content. Control continues at 1404.

At 1412, control selects the first search function that is available in the app. At 1420, control determines a breadcrumb trail to the selected search function. The breadcrumb trail is one or more API calls (such as intents) and user interface interactions that will navigate to the state where the search function can be actuated. At 1424, the search function is parameterized. In other words, a template is created including snippets of text and parameters, where the parameters can be replaced with various types of data in order to instantiate the template.

As part of parameterizing the search function, the human operator or automated onboarding system determines which entity type is required for each parameter. For example, a restaurant search function may allow for a specification of a cuisine, meaning that the entity type is cuisine. A movie information search function may take as input the name of a movie or the name of an actor. In this scenario, the search function may be annotated as having two different entity types. In other implementations, two search functions may be defined, where one search function requires a movie type of entity and the other search function requires an actor name type of entity.

At 1428, control identifies whether any of the parameters require enumerated entities. For example, one of the parameters may be a city, and the operator therefore identifies, such as by pointing and clicking, that the parameter will be satisfied by providing a text or numerical value for a city. These may be generic entities of a particular type (for example, city, zip code, movie, year, etc.). In another example, the enumerated entities may be a list of location identifiers unique to the app. These enumerated entities may be extracted from the app, such as by using a special-purpose crawler. Other parameters may allow for plain text and therefore be identified as plain text parameters not requiring one of a set of enumerated entities.

At 1432, control evaluates the search results generated by the search function and identifies access URLs to arrive at these search results. In other words, once a user of a user device decides to select one of the deep view cards, the corresponding app is opened to the corresponding state. The access URL template allows this to occur. In various implementations, the access URL template may be an http:// namespace template, which will open in an app if the app is present or will open in a web browser if the app is not present.

The access URL templates may be parameterized such that for each set of search results, visible information or hidden metadata will be used to determine an access URL that allows navigation to the search result in the app.

At 1436, user interface elements of the search results are tagged for deep view card creation. This tagging of user interface elements may be performed using a point and click interface by an operator of the search system 100. For example, the operator may identify a text field within the search results as a title of a search result and identify a graphic as a representative image for the search result. Further, the operator may tag a graphical representation of a number of stars as a rating for the result. These tagged items can then be arranged as desired to generate any DVC requiring these items.

At 1440, control determines whether there are additional search functions to analyze in the app. If so, control transfers to 1444; otherwise, control continues at 1448. At 1444, control selects the next search function and continues at 1420. The breadcrumb trail determined at 1420 is used by an emulator to reach the search functions so that the search function can be actuated. Meanwhile, the access URL determined at 1432 is used by the user device to navigate to a desired state corresponding to a selected search result. At 1448, control determines whether there is relevant unsearchable content remaining within the app. If so, control transfers to 1416; otherwise, control returns to 1404.

Figure 15:
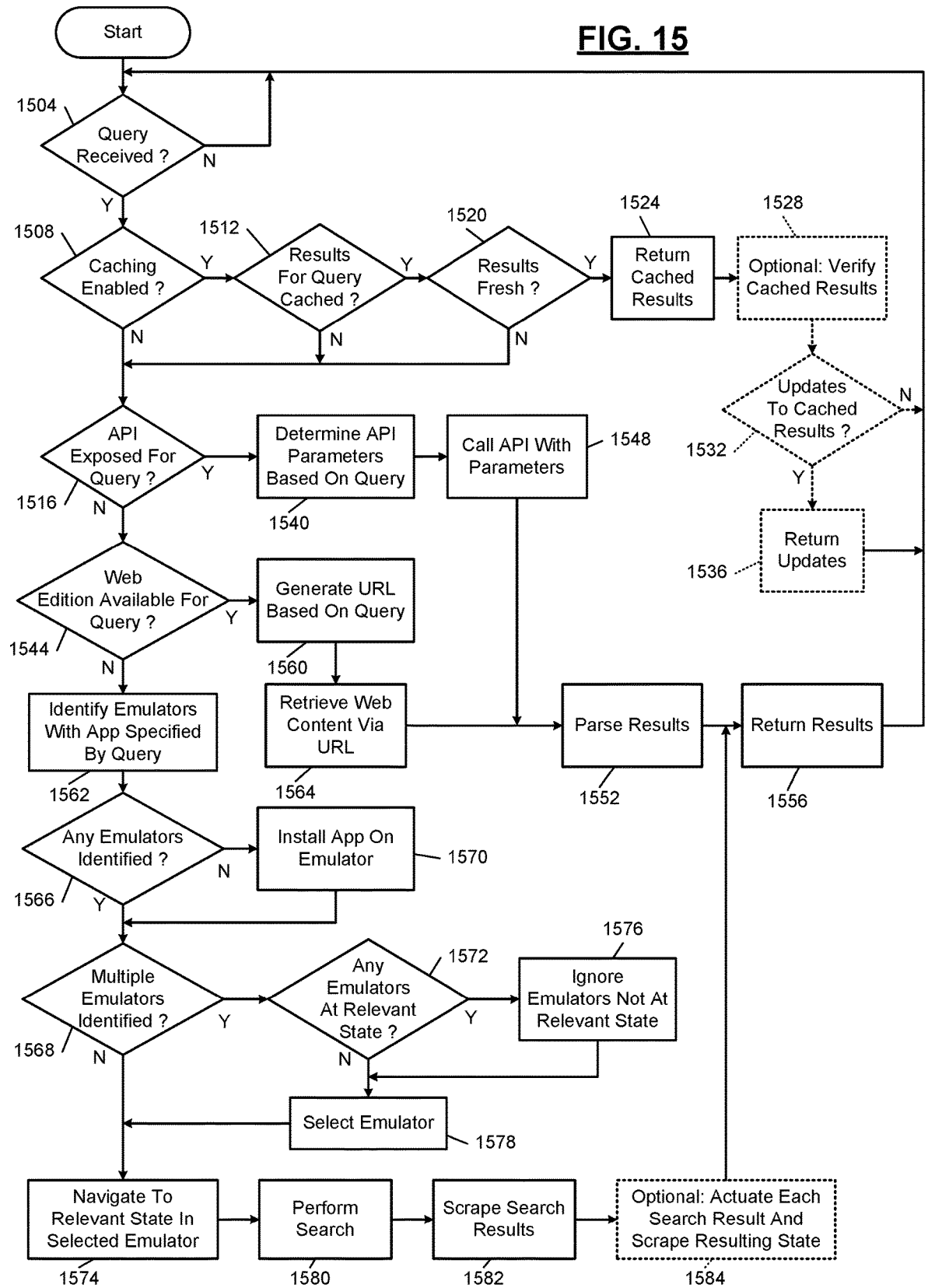
FIG. 15 is a flowchart showing example operation relating to routing a received query.

In FIG. 15, query routing control waits at 1504 until a query is received. The query specifies a specific app, a specific search function of the app, and parameters to supply to that search function. When a query is received, control continues at 1508. If caching is enabled, control transfers to 1512; otherwise, control transfers to 1516. If caching is not even implemented, 1508 can be omitted entirely. At 1512, control determines whether results for the specified query are cached. If so, control transfers to 1520; otherwise, control continues at 1516.

At 1520, control determines whether the cached results are fresh—that is, whether the results have been stored in the cache for less than an amount of time within which those results have historically been updated. If so, control transfers to 1524; otherwise, control continues at 1516. In other words, results being fresh mean that they are unlikely to have changed since being cached or at least that the confidence in the results still being accurate is above a certain threshold. Therefore, at 1524, control returns the cached results.

Control may then return to 1504 or continue at optional element 1528. At 1528, control may verify that the cached results are still accurate. This may involve reacquiring the results as described in more detail below. At 1532, if there had been updates to the cached results, control transfers to 1536; otherwise, control returns to 1504. At 1536, control returns the updates to the same destination as the cached results were sent. The cached results can then be updated—in some cases, before the results have even been surfaced to a user. Control then returns to 1504.

At 1516, control determines whether an API has been exposed for the query. The query specifies an app and a desired function. If the app developer has exposed (whether documented or not) an API and the search system is able to call, control continues at 1540; otherwise, control transfers to 1544. At 1540, control determines parameters for the API call based on the query. At 1548, control calls the API with the determined parameters. At 1552, control parses returned results and, at 1556, the parsed results are returned as query results. Control then returns to 1504.

At 1544, control determines whether a web edition of the app specified in the query is available. If so, control transfers to 1560; otherwise, control transfers to 1562. At 1560, control generates a URL (Uniform Resource Locator) based on the query and a URL template corresponding to the app and the function of interest. At 1564, control retrieves web content from the server specified by the URL. Control then continues at 1552.

At 1562, control identifies whether any emulators currently have the app installed. At 1566, if any emulators have been identified, control continues at 1568; otherwise, control transfers to 1570. At 1570 control selects an emulator for app installation. This process may be slow (in some cases, on the order of seconds), so the search system API service may send an interim message indicating that results will be delayed. This message may cause the delayed results to be removed from the results returned to the user device or may cause them to be demoted to a second page or off screen location. This gives additional time for the results to be obtained before a user may attempt to view them. After installing the app on the emulator, control continues at 1568.

At 1568, if multiple emulators have been identified that each have the app installed, control transfers to 1572; otherwise, control transfers to 1574. At 1572, control determines whether any of the identified emulators already have the app in the foreground and at the relevant state. If so, control transfers to 1576; otherwise, control transfers to 1578. At 1576, control ignores (that is, removes from the identified set) emulators where the app is not already in the foreground at the relevant state. Control then continues at 1578.

At 1578, an emulator is selected from the identified list. The emulator may be selected based on how popular other apps on that emulator are. It may be ideal to select an emulator that can service the request with very little at risk that another app installed in the emulator will be needed before the emulator can return results. Control continues at 1574.

At 1574, control navigates to the relevant state in the selected emulator as necessary. If the emulator is already at the relevant state, control proceeds immediately to 1580. Navigating to the relevant state may be performed by a combination of method calls and/or user interface event injection. At 1580, control performs a search based on the received query. For example, the received query may specify a text string to supply to the search state of the app and may also specify one or more other options (such as checkboxes or radio buttons) to specify.

At 1582, control scrapes the search results state. This may include scraping the visible results from the first state as well as scrolling or transitioning to a subsequent state that offers additional search results. As described above, scraping may include extracting text and metadata as well as taking screenshots, such as screenshots of individual ones of the search results.

At 1584, control optionally actuates one or more of the search results and scrapes data from the resulting state. Control then continues at 1556. For some apps, additional information may only be available by selecting the search result and going to the specific state for that search result. For example, a search result list of restaurants may include information such as location, rating, and a representative image, but the further state may provide additional data of interest to the search system, such as hours of operation.

Figure 16:
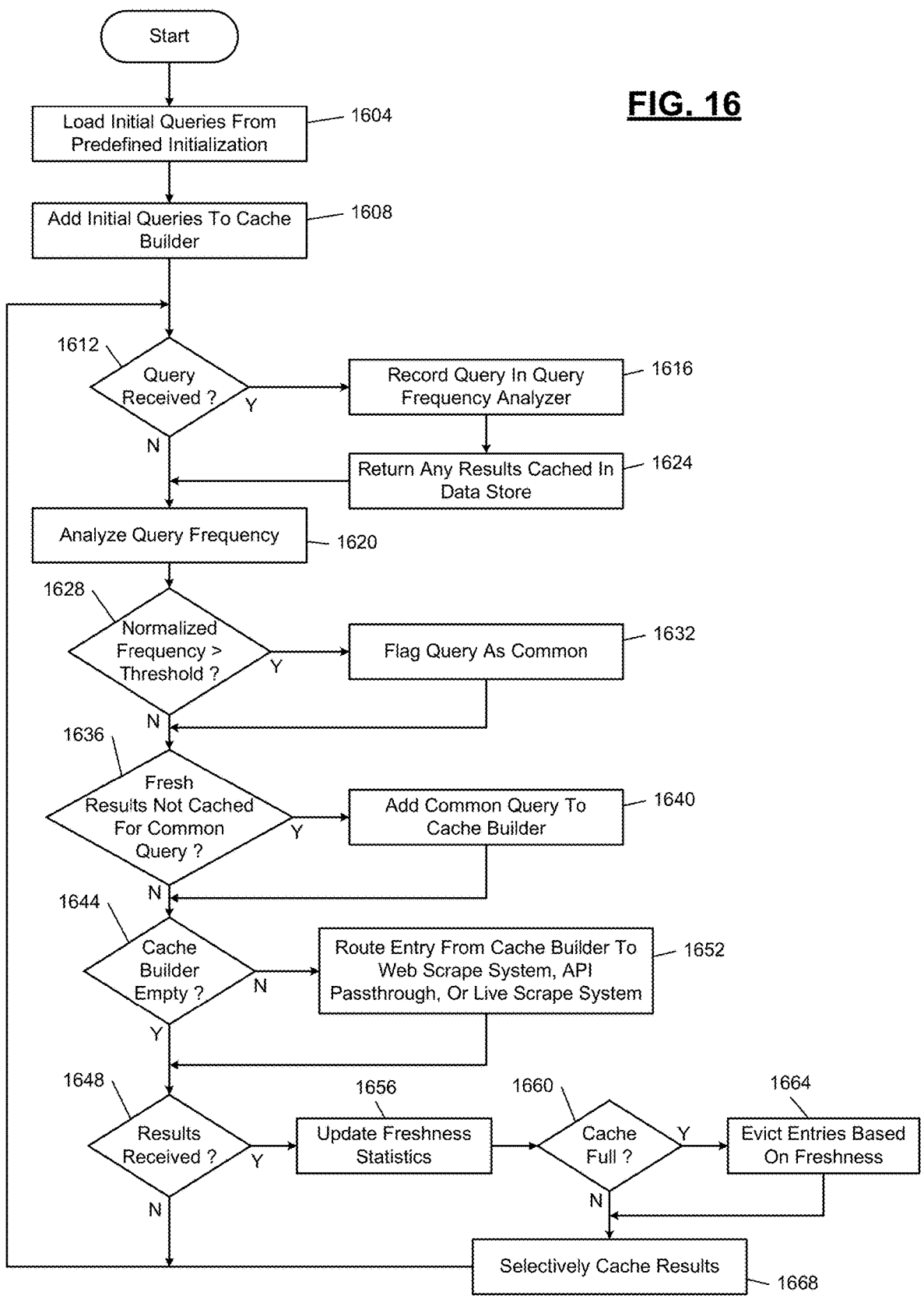
FIG. 16 is a flowchart showing example operation of a cache system according to the principles of the present disclosure.

In FIG. 16, example operation of a caching system, such as that shown in FIGS. 9 and 12, begins at 1604. Predefined queries are established by an operator of the search system based on an expectation of the frequency of various queries from various locations. For example, searches for restaurants may be extremely common for fifty different zip codes, while restaurant searches from the remaining zip codes in a country may be more sporadic. For movies, frequent searches may be expected for upcoming blockbuster movies as well as popular movies already in theaters.

The operator may seed the cache system with these expected queries so the cache system will be ready with results, decreasing latency for the most popular search results. At 1604, when operation of the cache system begins, these initial queries are loaded from the predefined initialization data and, at 1608, the initial queries are added to a cache builder. The cache builder maintains a queue of queries to run and obtain results for caching.

At 1612, the main operation of the cache system begins. If a query has been received, control transfers to 1616; otherwise, control transfers to 1620. At 1616, control records the received query in a query frequency analyzer data store. At 1624, control returns any results that are cached in the data store corresponding to the query. Control then continues at 1620.

At 1620, control analyzes query frequency based on recorded information in the query frequency analyzer. This analysis may include calculating statistics over time and normalizing how frequent a query is with respect to other queries. The statistical analysis of the query frequency may include a moving average filter so that queries that were once frequent but have become rare will gradually decrease in their analyzed frequency.

Query frequency may be measured at different levels of granularity. For example, the query frequency may be analyzed at the level of which app and function are specified in the query. Additionally or alternatively, more granular analysis may be performed, such as on specific values provided to the app for that function. At 1628, control determines whether there are any queries whose normalized frequency exceeds a threshold. If so, control transfers to 1632; otherwise, control transfers to 1636.

At 1632, control flags any query that exceeds the threshold as a common query. This will cause the query to be refreshed so that up-to-date data is generally present in the cache. Control then continues at 1636. At 1636, control determines whether fresh results are not cached for any common query. If so, control transfers to 1640; otherwise, control transfers to 1644. At 1640, control adds any common query for which up-to-date results are not cached to the cache builder. Control then continues at 1644.

At 1644, control determines whether the cache builder has an empty queue. If so, control continues at 1648; otherwise, control transfers to 1652. At 1652, control routes an entry from the cache builder to a data source. For example, routing decisions such as those shown in FIG. 15 may determine whether the entry is routed to systems including the web scrape system 924, the API passthrough 928, and the live scrape system 932 of FIG. 9. Control then continues at 1648.

At 1648, if results have been received, such as from an entry submitted by the cache builder at 1652 or from a query requested by a user, control transfers to 1656; otherwise, control returns to 1612. At 1656, control updates freshness statistics related to the results. For example, control may compare the timestamp of prior results cached for the same search to determine whether the results have changed. If results for a certain query frequently change over the course of a time period, it is likely that the useful time for keeping those results around is less than this time period.

As the time period between acquiring varying results decreases, there may be a lower threshold below which the cache system will not update cache results. If results to a query frequently change faster than this minimum interval, the cache system may determine that caching the query is not useful. One example implementation of this may be to set the expiration of these search results to zero indicating that they should not be cached.

At 1660, control determines whether the cache is full. This determination may be made based on whether a proportion of an allocated space for the cache results that is already in use exceeds a threshold percentage. If the cache is full, control transfers to 1664; otherwise, control transfers to 1668. At 1664, control evicts entries from the cache. The eviction decision may be based at least partially on freshness. Cache entries for results that are past their expected useful lifetime can be removed from the cache without substantial risk.

In fact, entries may be evicted based on freshness even when the cache is not considered to be full. This approach may be especially helpful when there is not a specified amount of storage space reserved for the cache. Minimizing the size of the cache is beneficial because storage may be inexpensive but is rarely free. Control continues at 1668.

At 1668, the received results are selectively cached. For example, results corresponding to a query with a very short expiration (indicating that attempting to cache results is fruitless) are not cached, but remaining results are. In various implementations, results are only cached once the normalized query frequency for the corresponding query increases above a threshold. This threshold may be lower than the threshold at 1628 that will cause a query to be considered common. Control then returns to 1612.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this app may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user apps, background services, background apps, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

What is claimed is:

1. A user device comprising:
   at least one processor;
   a display; and
   a memory configured to store instructions that, when executed by the at least one processor, cause the at least one processor to perform operations including:
   identifying a user input corresponding to a query for searching;

transmitting, to a search server, the query;
receiving a result corresponding to the query from the search server, wherein the result includes (i) an application programming interface (API) call that includes an instruction to place a first application into a first state and (ii) deep view card (DVC) instructions, and wherein the first state comprises a state to display items for modifying the API call;
in response to receiving the result from the search server and an item being selected, adding information to the API call included in the result corresponding to the query to provide the modified API call, wherein the added information includes at least one of a location of the user device, sensor data of the user device, an indication of at least one application installed on the user device, or at least one account associated with the user device, and transmitting the modified API call to a content acquisition system;
receiving a response from the content acquisition system that includes content based on the first state of the first application; and
in response to receiving the response from the content acquisition system, providing a DVC by applying the DVC instructions to the content included in the response, and controlling the display to display the DVC.

2. The user device of claim 1, wherein the operations further include at least one of (i) determining a screen size of the display or (ii) determining a resolution of the display; and
providing the DVC includes (i) generating and formatting the DVC based on the DVC instructions and (ii) scaling the DVC based on at least one of the determined screen size or the determined resolution.

3. The user device of claim 1, wherein controlling the display to display the DVC includes combining the DVC with content included in the result.

4. The user device of claim 1, wherein the API call includes an access mechanism to the first state of the first application.

5. The user device of claim 1, wherein the first state further comprises at least one of actions related to the result, items for changing the result, or specific information of the result.

6. A search system comprising:
at least one processor; and
a memory configured to store instructions that, when executed by the at least one processor, cause the at least one processor to perform operations including:
receiving, from a user device, a query for searching,
transmitting a result corresponding to the query, wherein the result includes (i) an application programming interface (API) call that includes an instruction to place a first application into a first state and (ii) deep view card (DVC) instructions, wherein the first state comprises a state to display items for modifying the API call,
receiving, from the user device, a modified API call, wherein the modified API call comprises at least one of a location of the user device, sensor data of the user device, an indication of at least one application installed on the user device, or at least one account associated with the user device, and
in response to receiving the modified API call, (i) placing the first application into the first state, (ii) obtaining content from an instance of the first application in the first state, and (iii) transmitting the content to the user device.

7. The search system of claim 6, wherein the first state further comprises at least one of actions related to the result, items for changing the result, or specific information of the result.

8. The search system of claim 6, wherein the operations further comprise:
storing information based on the content, and in response to a second query matching a first query, selectively providing the information to the user device for presentation to a user.

9. The search system of claim 8, wherein the operations further comprise:
monitoring freshness of the stored information; and
determining a frequency at which content in the first state of the first application changes, and the freshness of the information is inversely proportional to the frequency at which the content in the first state of the first application changes or inversely proportional to an age of the information.

10. The search system of claim 8, wherein the operations further comprise:
after a delay period following the first query, providing a refresh query based on the first query to a live scrape system, and updating the information stored from results returned in response to the refresh query, and predicting a user query and providing the predicted user query to the live scrape system; and
storing information returned by the live scrape system responsive to the predicted user query and in response to the predicted user query, receiving a third query matching the predicted user query, and providing the information related to the predicted user query to the user device.

11. The search system of claim 6, wherein the operations further comprise:
determining relative frequencies of a plurality of queries, wherein a cache manager is configured to preferentially retain information for queries having higher relative frequencies, and discard information for queries having lower relative frequencies.

12. The search system of claim 6, wherein the operations further comprise:
providing a refresh query based on a common query to a live scrape system and updating information related to the common query based on results returned by the live scrape system in response to the refresh query,
in response to a third query, determining whether there is information stored for the third query;
in response to presence of information stored for the third query, selectively providing the information stored for the third query to the user device; and
in response to non-presence information stored for the third query, selectively providing the third query to the live scrape system.

13. A method of a user device comprising:
identifying a user input corresponding to a query for searching;
transmitting, to a search server, the query;
receiving, from the search server, a result corresponding to the query, wherein the result includes (i) an application programming interface (API) call that includes an instruction to place a first application into a first state and (ii) deep view card (DVC) instructions, and wherein the first state comprises a state to display items for changing the result;

in response to receiving the result from the search server and an item being selected, adding information to the API call included in the result corresponding to the query to provide the modified API call, wherein the added information includes at least one of a location of the user device, sensor data of the user device, an indication of at least one application installed on the user device, or at least one account associated with the user device, and transmitting, by the user device, the modified API call to a content acquisition system;

receiving, by the user device, a response from the content acquisition system that includes content based on the first state of the first application; and in response to receiving the response from the content acquisition system, providing a DVC by applying the DVC instructions to the content included in the response, and controlling a display to display the DVC.

14. The method of claim 13, further comprising at least one of determining a screen size of the display or determining a resolution of the display,
wherein providing the DVC includes (i) generating and formatting the DVC based on the DVC instructions and (ii) scaling the DVC based on at least one of the determined screen size or the determined resolution.

15. The method of claim 13, wherein controlling the display to display the DVC includes combining the DVC with content included in the result from the search server.

16. The method of claim 13, wherein the API call includes an access mechanism to the first state of the first application.

17. The method of claim 13, wherein the first state further comprises at least one of actions related to the result, items for changing the result, or specific information of the result.

18. A computer program product encoded on a non-transitory computer readable storage medium comprising instructions that, when executed by a processing device, cause the processing device to perform operations including:
identifying a user input corresponding to a query for searching;
transmitting, to a search server, the query;
receiving a result corresponding to the query from the search server, wherein the result includes (i) an application programming interface (API) call that includes an instruction to place a first application into a first state and (ii) deep view card (DVC) instructions, and wherein the first state comprises a state to display items for modifying the API call on a display of the processing device;

in response to receiving the result from the search server and an item being selected, adding information to the API call included in the result corresponding to the query to provide the modified API call, wherein the added information includes at least one of: a location of the processing device, sensor data of the processing device, an indication of at least one application installed on the processing device, or at least one account associated with the processing device, and transmitting the modified API call to a content acquisition system;

receiving a response from the content acquisition system that includes content based on the first state of the first application; and in response to receiving the response from the content acquisition system, providing a DVC by applying the DVC instructions to the content included in the response, and displaying the DVC on the display.

19. The computer program product of claim 18, wherein the operations further include at least one of (i) determining a screen size of the display or (ii) determining a resolution of the display; and
providing the DVC includes (i) generating and formatting the DVC based on the DVC instructions and (ii) scaling the DVC based on at least one of the determined screen size or the determined resolution.

20. The computer program product of claim 18, wherein the API call includes an access mechanism to the first state of the first application.

21. The computer program product of claim 18, wherein:
the operations further include (i) determining a screen size of the display and (ii) determining a resolution of the display;
providing the DVC includes (i) generating and formatting the DVC based on the DVC instructions and (ii) scaling the DVC based on the determined screen size or the determined resolution; and
displaying the DVC includes combining the DVC with content included in the result.

22. The computer program product of claim 18, wherein the first state further comprises at least one of actions related to the result, items for changing the result, or specific information of the result.

* * * * *